United States Patent
Hsu et al.

(10) Patent No.: US 12,519,055 B2
(45) Date of Patent: Jan. 6, 2026

(54) STACKING VIA CONFIGURATION FOR ADVANCED SILICON NODE PRODUCTS AND METHODS FOR FORMING THE SAME

(71) Applicant: Taiwan Semiconductor Manufacturing Company Limited, Hsinchu (TW)

(72) Inventors: Chien Hao Hsu, Zhubei (TW); Wei-Hsiang Tu, Hsinchu (TW); Yen-Kun Lai, New Taipei (TW); Kuo-Chin Chang, Chiayi (TW); Mirng-Ji Lii, Sinpu Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 823 days.

(21) Appl. No.: 17/735,560

(22) Filed: May 3, 2022

(65) Prior Publication Data

US 2023/0361022 A1 Nov. 9, 2023

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76816* (2013.01); *H01L 23/528* (2013.01)

(58) Field of Classification Search
None
See application file for complete search history.

(56) References Cited

U.S. PATENT DOCUMENTS

| | | | | |
|---|---|---|---|---|
| 9,048,231 | B2* | 6/2015 | Hou | H01L 24/09 |
| 12,230,539 | B2* | 2/2025 | Komatsu | H01L 23/5226 |
| 2019/0198426 | A1* | 6/2019 | Choi | H01L 21/3212 |
| 2020/0043778 | A1* | 2/2020 | Komatsu | H01L 21/76837 |
| 2023/0069734 | A1* | 3/2023 | Lai | H01F 17/0006 |
| 2023/0094686 | A1* | 3/2023 | Darmawikarta | H05K 3/24 257/774 |
| 2023/0096434 | A1* | 3/2023 | Park | H01L 23/528 257/110 |
| 2023/0299023 | A1* | 9/2023 | Huang | H01L 24/13 |

* cited by examiner

*Primary Examiner* — Michelle Mandala
(74) *Attorney, Agent, or Firm* — The Marbury Law Group, PLLC

(57) ABSTRACT

An electrical connection structure includes a dielectric layer stack of a plurality of dielectric layers including a first dielectric layer as an uppermost layer, and a second dielectric layer under the first dielectric layer, a plurality of metal layers in the plurality of dielectric layers, a via stack in the plurality of dielectric layers that connects the plurality of metal layers, an upper metal layer on the dielectric layer stack over the via stack, and an upper dielectric layer on the dielectric layer stack and including an upper dielectric layer opening over the upper metal layer and the via stack. A number of first vias in the first dielectric layer, may be less than or equal to a number of second vias in the second dielectric layer, and the number of second vias in the second dielectric layer may be less than or equal to 3.

20 Claims, 18 Drawing Sheets

STACKING VIA CONFIGURATION FOR ADVANCED SILICON NODE PRODUCTS AND METHODS FOR FORMING THE SAME

BACKGROUND

A semiconductor device (e.g., semiconductor die) may include an electrical connection structure including a dielectric layer stack. The dielectric layer stack may serve, for example, as an intermetal dielectric (IMD) or interlayer dielectric (ILD). The dielectric layer stack may include metal interconnects including metal layers (e.g., metal traces) and metal vias connecting the metal layers. Generally, there are no constraints on the manner in which the metal vias are arranged in the dielectric layer stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
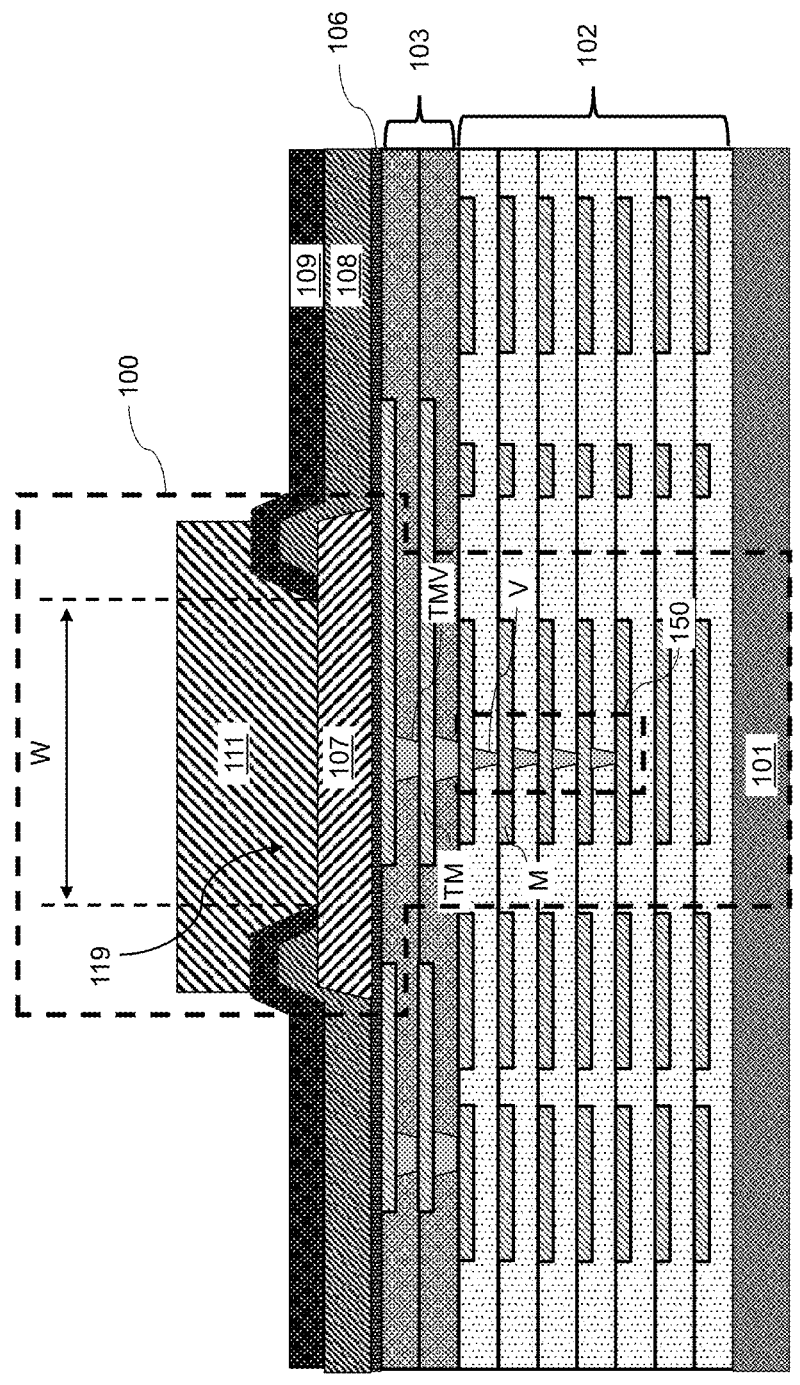
FIG. 1A is a vertical cross-sectional view of an electrical connection structure that may be included in a semiconductor die (e.g., semiconductor device) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A substrate such as a package substrate may expand at a high temperature (e.g., 25° C. to 125° C.). Such thermal expansion may create a high pulling force in a core region of a semiconductor die that is mounted on the substrate. The high pulling force may cause a high stress to be applied to the vias (e.g., metal vias) in the dielectric layers (e.g., IMD or ILD) of the semiconductor die.

Via stress sensitivity in the dielectric layers of the semiconductor die may not be uniform. That is, there may be a via stress sensitivity based on a via location relative to an opening in an upper dielectric layer which may be referred to as a PIO (e.g., polyimide layer opening). In particular, a via that is part of a via stack in a region under the PIO may be more vulnerable to thermal expansion and stress than vias that are located outside the region under the PIO.

An unconstrained via stacking configuration may promote the formation of a via crack or via delamination at a dielectric layer in the dielectric layer stack (e.g., an extreme low-k dielectric (ELK) layer). The crack or delamination of a via in an ELK layer may be especially problematic in advanced silicon node products.

In particular, stacking via cracks in an ELK layer under the opening in the upper dielectric layer may occur in an advanced silicon node product after a reliability test. The failure may be induced, for example, by a high pull force under a thermal cycling high temperature condition. Accordingly, designs and configuration that may mitigate against such crack or delamination of a via in an ELK layer are desired.

Various embodiments disclosed in the present disclosure may include an electrical connection structure that may be part of a semiconductor die or semiconductor package. The electrical connection structure may include a dielectric layer stack, a plurality of metal layers in the dielectric layer stack, a via stack in the dielectric layer stack and including a plurality of vias connecting the plurality of metal layers, an upper metal layer on the dielectric layer stack, and an upper dielectric layer on the dielectric layer stack and including an opening over upper metal layer and the via stack.

The via stack in the electrical connection structure may include a constrained via stacking configuration. That is, there may be one or more constraints that may restrict a configuration of the vias in the via stack. For example, a number of first vias in the plurality of vias, that are above second vias in the plurality of vias may be less than or equal to a number of the second vias, and the number of second vias in the plurality of vias may be less than or equal to 3.

The constrained configuration of the stacked vias may mitigate against a via crack or via delamination at a dielectric layer (e.g., an ELK dielectric layer). The constrained configuration of the stacked vias may also help to achieve a good yield for manufacture. The stacked via configuration may be especially helpful where the stacked vias are located under an opening in the upper dielectric layer (e.g., a polymer dielectric layer). The stacked via configuration may be especially helpful in inhibiting delamination in advanced silicon node products.

FIG. 1A is a vertical cross-sectional view of an electrical connection structure 100 that may be included in a semiconductor die (e.g., semiconductor device) according to one or more embodiments. The semiconductor die may include, for example, a memory die (e.g., dynamic random access memory (DRAM)) including DRAM memory cells, or a processing unit (e.g., central processing unit (CPU)) including logic circuitry. One of ordinary skill in the art will appreciate that the above examples are provided for illustrative purposes only to further explain applications of the present disclosure and are not meant to limit the present disclosure in any manner.

As illustrated in FIG. 1A, the electrical connection structure 100 may include a substrate 101. The substrate 101 may include a semiconductor substrate such as a silicon substrate. Alternatively, the substrate 101 may be a silicon-on-insulator substrate.

One or more electrical devices (e.g., field effect transistors (FETs), memory cells) and electrical circuits may be formed on and/or in the substrate 101. The electrical devices and electrical circuits formed on/in the substrate 101 may be any type of device or circuit suitable for a particular application. The electrical devices and circuits formed on and/or in the substrate 101 may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

The electrical connection structure 100 may also include a dielectric layer stack 102 (or at least portions of the dielectric layer stack 102) and a plurality of metal layers M (e.g., metal traces) formed within the dielectric layer stack 102. The electrical connection structure 100 may also include via stack 150 formed in the dielectric layer stack 102. The via stack 150 may include a plurality of vias V that connect the plurality of metal layers M to one another. The metal layers M and vias V in the via stack 150 may be made of metallic materials such as copper, copper alloys, aluminum, silver, gold and any combinations thereof. Other suitable metallic materials are within the contemplated scope of disclosure. In one or more embodiments, the vias V in the via stack may have a substantially rectangular shape in a plan view, and the metal layers M may have a substantially rectangular shape in a plan view. Other suitable plan view shapes such as ovals, circles, and other polygons, are within the contemplated scope of disclosure.

The dielectric layer stack 102 may serve, for example, as an intermetal dielectric (IMD) or interlayer dielectric (ILD) in a semiconductor die containing the electrical connection structure 100. In particular, the dielectric layer stack 102 may serve as back-end of line (BEOL) interconnects or front-end of line (FEOL) interconnects for sub-micron technology (e.g., 65 nm, 45 nm, 32 nm node and beyond).

The dielectric layer stack 102 may, for example, cover patterns formed in the substrate 101 and any surface of the substrate 101 not covered by the patterns. The dielectric layer stack 102 may include one or more layers of dielectric materials (e.g., insulating materials) such as silicon oxide, silicon nitride, SiON, SiOCN, formed, for example, by low pressure chemical vapor deposition (LPCVD), plasma enhanced chemical vapor deposition (PECVD), flowable chemical vapor deposition (flowable CVD), or any other suitable processes. In some embodiments, the dielectric materials may include spin-on-glass (SOG) or fluoride-doped silicate glass (FSG).

In some embodiments, the dielectric layer stack 102 may include an extreme low-k (ELK) dielectric material or a low-k dielectric having a dielectric constant greater than that of the ELK but less than thermal silicon oxide. In some embodiments, the dielectric layer stack 102 may include a porous layer. In some embodiments, the ELK material may include one or more of fluorine-doped silicon dioxide (FSG), carbon-doped silicon dioxide (SOC), porous silicon dioxide, or porous (SiOC). The materials used to form the dielectric layer stack 102 are not limited to these examples, but may include any other suitable materials. While FIG. 1A illustrates a dielectric layer stack 102 with seven layers, embodiments with other number of layers, subject to the constraints discussed below, are contemplated.

As used in this disclosure, the terms "ELK dielectric", "ELK dielectric layer" and "ELK dielectric material" may be understood to mean a material having a dielectric constant of 2.5 or less. In particular, the terms may be understood to include a "porous low-k" material having a dielectric constant of 2.0 or less. The ELK dielectric layers may be advantageously used with silicon oxide-based low-k dielectric materials having an interconnecting porous structure and a dielectric constant of less than about 2.5.

The ELK dielectric material may provide a number of advantageous features with respect to traditional LK material. For example, the ELK dielectric material may improve coupling capacitance of metal interconnect lines (e.g., IMD metal interconnect lines) by more than 1% to 1.5%, resulting in higher speed of a semiconductor die including the electrical connection structure 100. Further, the ELK dielectric material may be more reliable and is less prone to damage than traditional LK material.

The electrical connection structure 100 may also include a top dielectric structure 103 on the dielectric layer stack 102. The top dielectric structure 103 may include top dielectric layers (e.g., low-k dielectric layers) composed of the same or similar dielectric materials as in the dielectric layer stack 102. Top metal connectors TM (e.g., metal traces) may be embedded in the top dielectric layers of a top dielectric structure 103. Top metal vias TMV may also be formed in the top dielectric layers of the top dielectric structure 103. The TMV may provide an electrical connection to the top metal connectors TM. The top metal connectors TM and top metal vias TMV may provide a conductive channel to the metal layers M of the dielectric layer stack 102. The top metal connectors TM and top metal vias TMV may be made of metallic materials such as copper, copper alloys, aluminum, silver, gold and any combinations thereof. Other suitable metallic materials are within the contemplated scope of disclosure.

The electrical connection structure 100 may also include a first passivation layer 106 on the top dielectric structure 103. The first passivation layer 106 may be formed of non-organic materials such as un-doped silicate glass, silicon nitride, silicon oxide and the like. Alternatively, the first passivation layer 106 may be formed of low-k dielectric such as carbon doped oxide and the like. In addition, extremely low-k (ELK) dielectrics such as porous carbon-doped silicon dioxide can be used to form the first passivation layer 106.

An upper metal layer 107 may be formed on the first passivation layer 106. The upper metal layer 107 may, for example, be part of a redistribution layer (RDL) structure. The upper metal layer 107 may also be a bonding pad or contact pad. The upper metal layer 107 may provide an electrical connection with the top metal connectors TM and metal layers M. The upper metal layer 107 may be composed, for example, of aluminum. Alternatively, the upper metal layer 107 may include other metals such as copper, or other suitable conductive materials. The upper metal layer 107 may have a thickness in a range from about 1 μm to 50 μm, although greater or lesser thicknesses may be used. The upper metal layer 107 may include a rectangular shape in a plan view. Other suitable plan view shapes may be used. A center of the upper metal layer 107 in the X-Y plane may be substantially aligned with a center of the via stack 150 in the dielectric layer stack 102.

A second passivation layer 108 may be formed on top of the first passivation layer 106 and on the upper metal layer 107. The second passivation layer 108 may be composed of materials that are similar to materials of the first passivation layer 106. The second passivation layer 108 may have a thickness that is substantially similar to the thickness of the upper metal layer 107.

The second passivation layer 108 may be patterned to include an opening over the upper metal layer 107. An outer perimeter of an upper surface of the upper metal layer 107 may covered by the second passivation layer 108. A central portion of the upper surface may be exposed (e.g., partly exposed) through the opening in the second passivation layer 108. The opening in the second passivation layer 108 may include a rectangular shape in a plan view and may be substantially aligned with the upper metal layer 107. Other plan view shapes of the opening in the second passivation layer 108 are within the contemplated scope of disclosure.

As illustrated in FIG. 1A, the upper metal layer 107 may be laterally surrounded by the first passivation layer 106 and second passivation layer 108. In particular, a bottom portion of the upper metal layer 107 may be bounded by (e.g., embedded in) the first passivation layer 106 and a side portion and the outer perimeter of the upper surface of the upper metal layer 107 may be surrounded by the second passivation layer 108. The first passivation layer 106 and second passivation layer 108 may overlap and seal an edge (e.g., outer sidewall) of the upper metal layer 107 so as to improve electrical stability by inhibiting corrosion at the edge of the upper metal layer 107. In addition, the first passivation layer 106 and second passivation layer 108 may help to reduce a leakage current in the electrical connection device 100.

An upper dielectric layer 109 may be formed on the second passivation layer 108 and on the upper metal layer 107. The upper dielectric layer 109 may be composed of one or more polymer materials (e.g., dielectric polymer materials) such as benzocyclobutene (BCB) polymer, polyimide (PI), polybenzoxazole (PBO) or a combination thereof. Other suitable polymer materials are within the contemplated scope of disclosure. In one or more embodiments, the upper dielectric layer 109 may be composed of photo-definable polyimide materials made from commercially available products such as HD4104 (e.g., negative-tone, solvent developed, photo-definable polyimide precursor).

As illustrated in FIG. 1A, the upper dielectric layer 109 may be conformally formed on the second passivation layer 108. Thus, a shape of the upper dielectric layer 109 may follow a shape of the second passivation layer 108 around the outer perimeter of the upper surface of the upper metal layer 107. The upper dielectric layer 109 may be patterned to include an upper dielectric layer opening (UDLO) 119. The UDLO 119 may have a width W (in the x-direction) that is in a range from 20% to 80% of a width (in the x-direction) of the upper metal layer 107. The UDLO 119 may include a rectangular shape in a plan view, although other shapes may be within the contemplated scope of this disclosure. The UDLO 119 may also be substantially aligned with the upper metal layer 107.

The electrical connection structure 100 may also include underbump metallization (UBM) (not shown) on the upper surface of the upper metal layer 107 in the UDLO 119. The UBM may be conformally formed on the UDLO 119 and contact the upper surface of the upper metal layer 107 through the UDLO 119. The UBM may be electrically connected to the metal layers M by way of the upper metal layer 107.

The UBM may include, for example, a diffusion barrier layer and a seed layer. A width (in the x-direction) of each of the diffusion barrier layer and seed layer may be substantially the same. That is, a width of the UBM may be substantially uniform. The width of the UBM may be greater than the width W of the UDLO 119 such that a portion of the UBM may be formed outside of the UDLO 119 and on an upper surface of the upper dielectric layer 109 that surrounds the UDLO 119. The diffusion barrier layer may contact the upper metal layer 107 and include, for example, tantalum nitride, titanium nitride, tantalum, titanium, or the like. The seed layer may be formed on the diffusion barrier layer and include, for example, copper, silver, chromium, nickel, tin, gold, and combinations thereof. The seed layer may have a thickness, for example, in a range from 50 nm to 300 nm.

A metal bump 111 may be formed in the UDLO 119 and contact the upper surface of the upper metal layer 107. The metal bump 111 may be part of an interconnect structure such as a microbump interconnect structure or a C4 interconnect structure. In instances in which a UBM is formed in the UDLO 119, then the metal bump 111 may be formed on the UBM. In one or more embodiments, the metal bump 111 may include a metal pillar such as a copper pillar (e.g., copper post). The copper pillar may have a thickness, for example, in a range from 10 μm to 90 μm. The copper pillar may include a rectangular shape or circular shape in a plan view and may be substantially aligned with the UDLO 119 and/or the upper metal layer 107. Other plan view shapes of the copper pillar are within the contemplated scope of disclosure. In one or more embodiments, the metal bump 111 may include a solder ball. The solder ball may be made of any of suitable materials. In one or more embodiments, for example, the solder ball may include SAC405 (e.g., about 95.5% Sn, 4.0% Ag and 0.5% Cu).

An encapsulating material (not shown) may be formed on the upper dielectric layer 109 and on a side of the metal bump 111. The encapsulating material may include, for example, a package underfill material (e.g., epoxy polymer layer).

Figure 1B:
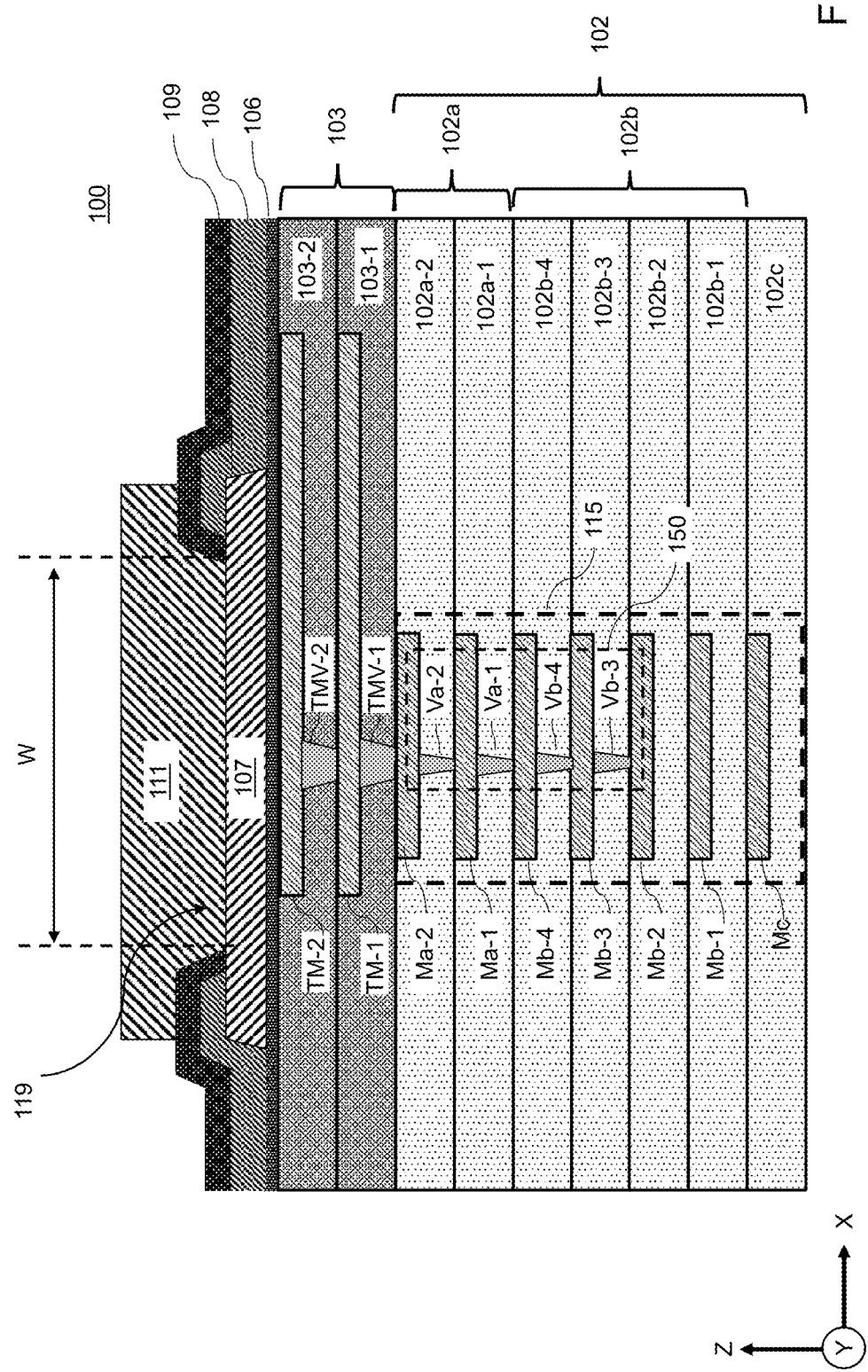
FIG. 1B is a vertical cross-sectional view of the electrical connection structure according to one or more embodiments.

FIG. 1B is a vertical cross-sectional view of the electrical connection structure 100 according to one or more embodiments. In particular, FIG. 1B provides a more detailed view of the dielectric layer stack 102.

As illustrated in FIG. 1B, the top dielectric structure 103 may include a first top dielectric layer 103-1 including a top metal connector TM-1 and a top metal via TMV-1 connected to a bottom of the top metal connector TM-1. The top dielectric structure 103 may also include a second top dielectric layer 103-2 including a top metal connector TM-2 and a top metal via TMV-2 connected to a bottom of the top metal connector TM-2.

The top dielectric structure 103 may be formed on the dielectric layer stack 102. The dielectric layer stack 102 may include first dielectric layers 102a that may be formed in contact with the top dielectric structure 103. The dielectric layer stack 102 may also include second dielectric layers 102b under the first dielectric layers 102a, and one or more third dielectric layers 102c under the second dielectric layers 102b. The first dielectric layers 102a, second dielectric layers 102b and third dielectric layers 102c may be different from each other in terms of materials and/or thickness. For example, the first dielectric layers 102a may be composed of a first material and have a first thickness, whereas the second dielectric layers 102b may be composed of a second material different than the first material and have a second thickness that is different than the first thickness. While FIG. 1B illustrates a dielectric layer stack 102 with seven layers, embodiments with other number of layers, subject to the design constraints discussed below, are contemplated.

The first dielectric layers 102a may include first dielectric layer 102a-1, and first dielectric layer 102a-2. First metal layers Ma-1 and Ma-2 may be formed in the first dielectric layers 102a-1, 102a-2, respectively. The second dielectric layers 102b may include second dielectric layers 102b-1, 102b-2, 102b-3 and 102b-4. Second metal layers Mb-1, Mb-2, Mb-3 and Mb-4 may be formed in the second dielectric layers 102b-1, 102b-2, 102b-3 and 102b-4, respectively. The dielectric layer stack 102 may also include one or more third dielectric layers 102c. Third metal layer Mc may be formed in the third dielectric layer 102c.

The first dielectric layers 102a, second dielectric layers 102b and third dielectric layer 102c may have substantially the same thicknesses and may be composed of substantially the same materials. In particular, the first dielectric layers 102a, second dielectric layers 102b and third dielectric layer 102c may be composed of ELK dielectric materials.

The first metal layers Ma-1 and Ma-2, second metal layers Mb-1, Mb-2, Mb-3, Mb-4, and third metal layer Mc may be substantially aligned in the Z-direction in FIG. 1B. The first metal layers Ma-1 and Ma-2, second metal layers Mb-1, Mb-2, Mb-3, Mb-4, and third metal layer Mc may also have substantially the same thicknesses and may be composed of substantially the same materials. The first metal layers Ma-1 and Ma-2, second metal layers Mb-1, Mb-2, Mb-3, Mb-4, and third metal layer Mc may also have substantially the same length in the X-direction and width in the Y-direction in FIG. 1B. Thus, the first metal layers Ma-1 and Ma-2, second metal layers Mb-1, Mb-2, Mb-3, Mb-4, and third metal layer Mc may have the same area in a plan view, and may also have the substantially the same volume and mass.

The first dielectric layer 102a-1 may also include first via Va-1 connected to a bottom of the first metal layer Ma-1. The first dielectric layer 102a-2 may include first via Va-2 connected to a bottom of the first metal layer Ma-2. The second dielectric layer 102b-3 may include second via Vb-3 connected to a bottom of the second metal layer Ma-3. The second dielectric layer 102b-4 may include second via Vb-4 connected to a bottom of the second metal layer Mb-4.

As illustrated in FIG. 1B, the first vias Va-1 and Va-2, and second vias Vb-3, Vb-4, may constitute a via stack 150 in the dielectric layer stack 102. The first vias Va-1 and Va-2 may have a substantially uniform width. The second vias Vb-3, Vb-4 may have a substantially uniform width. The width of the first vias Va-1, Va-2 may be substantially the same as the width of the second vias Vb-3, Vb-4. Alternatively, the first vias Va-1, Va-2 may have a width that is greater than a width of the second vias Vb-3, Vb-4. In particular, a width of the first vias Va-1, Va-2 may be in a range from 1.05 times to 1.7 times a width of the second vias Vb-3, Vb-4 in the via stack 150. The width of each of the first vias Va-1, Va-2 and second vias Vb-3, Vb-4 may, for example, be in a range from 0.001 μm to 1 μm.

The first vias Va-1 and Va-2 may have a substantially uniform length in the Z-direction. The second vias Vb-3, Vb-4 may have a substantially uniform length in the Z-direction. The first vias Va-1, Va-2 may have a length in the Z-direction that is the same or different than a length in the Z-direction of the second vias Vb-3, Vb-4.

The first vias Va-1 and Va-2, and second vias Vb-3, Vb-4, may also be substantially aligned in the Z-direction in FIG. 1B. The first vias Va-1 and Va-2, and second vias Vb-3, Vb-4 may be located under the upper metal layer 107, and may also be substantially concentric with the upper metal layer 107.

As also illustrated in FIG. 1B, a region of the dielectric layer stack 102 that is under the UDLO 119 may be designated as a via stack checking region 115. The via stack checking region 115 may include a region (e.g., a volume or 3-D region) of the dielectric layer stack 102 in which a configuration (e.g., arrangement) of the vias may be constrained (e.g., subject to a constraint).

That is, in the via stack checking region 115, there may be several constraints that may restrict a configuration of the vias in the via stack 150. For example, under a first constraint, a total number of vias in the via stack 150 may be greater than or equal to 2. Under a second constraint, a number of the first vias (Va-1, Va-2) in the via stack 150 may be less than or equal to the number of second vias (Vb-3, Vb-4) in the via stack 150. Under a third constraint, a number of the second vias (Vb-3, Vb-4) in the via stack 150 may be less than or equal to 3. Under a fourth constraint (not illustrated in FIG. 1B), when the via stack 150 includes 3 second vias (Vb) and there are more than 3 second metal layers (Mb) in the stacked dielectric layers 102, then the uppermost second via (Vb_top) may not be a stacked second via (Vb) (e.g., may not be in the via stack 150).

A constrained configuration of the vias in the via stack 150 may help to mitigate against a via crack or via delamination at a dielectric layer (e.g., an ELK dielectric layer) in the dielectric layer stack 102 of the electrical connection structure 100. The constrained configuration of the vias in the via stack 150 may also help to achieve a good yield for manufacture of the semiconductor dies containing the electrical connection structure 100.

Figure 2B:
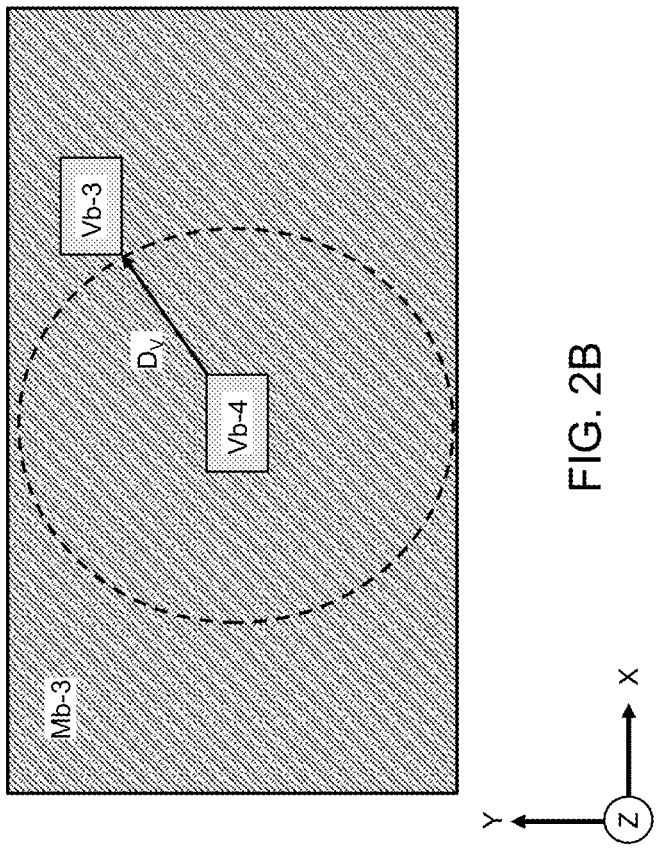
FIG. 2B illustrates is a plan view of the second metal layer with stacked second vias according to one or more embodiments.
Figure 2A:
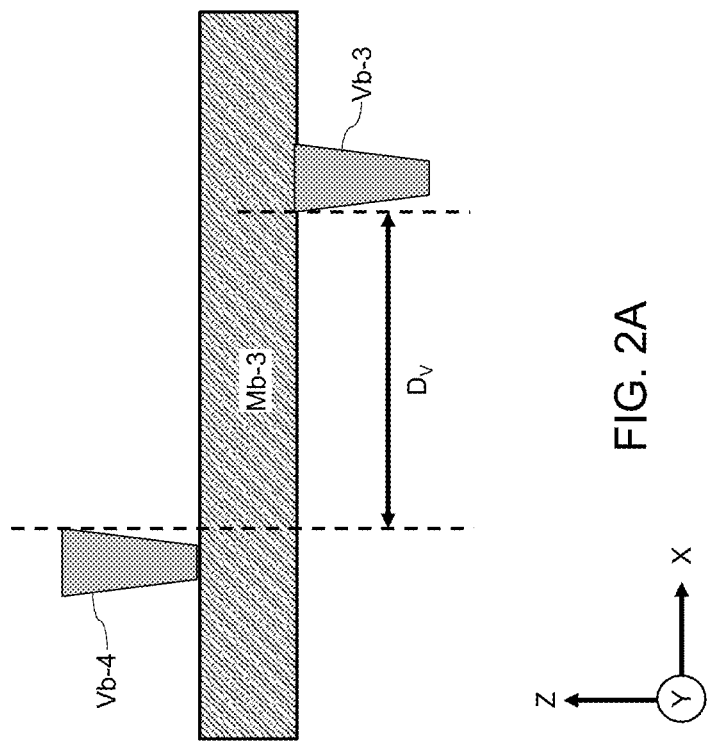
FIG. 2A is a vertical cross-sectional view of a second metal layer with stacked second vias according to one or more embodiments.

FIG. 2A is a vertical cross-sectional view of a second metal layer (e.g., Mb-3) with stacked second vias according to one or more embodiments. As illustrated in FIG. 2A, when a distance $D_v$ (e.g., a shortest distance) between a second via (e.g., Vb-4) that is connected to a top of a second metal layer (e.g., Mb-3) having an area less than or equal to 0.0228 $\mu m^2$, and a second via (e.g., Vb-3) that is connected to a bottom of the second metal layer, is less than or equal to 26.5 nm, then the pair of second vias Vb-3, Vb-4 may constitute "stacked vias".

FIG. 2B illustrates is a plan view of the second metal layer (e.g., Mb-3) with stacked second vias according to one or more embodiments. As illustrated in FIG. 2B, a location of the second via Vb-3 may be in any X-direction or Y-direction from the location of the second via Vb-4. In embodiments in which the distance $D_v$ between the second via Vb-4 and the second via Vb-3 is less than or equal to 26.5 nm, and the second metal layer Mb-3 has an area (e.g., in the plan view) that is less than or equal to 0.0228 $\mu m^2$, then the pair of second vias Vb-3, Vb-4 may constitute "stacked vias".

FIGS. 3A-3G illustrate a method of making an electrical connection structure according to one or more embodiments.

Figure 3A:
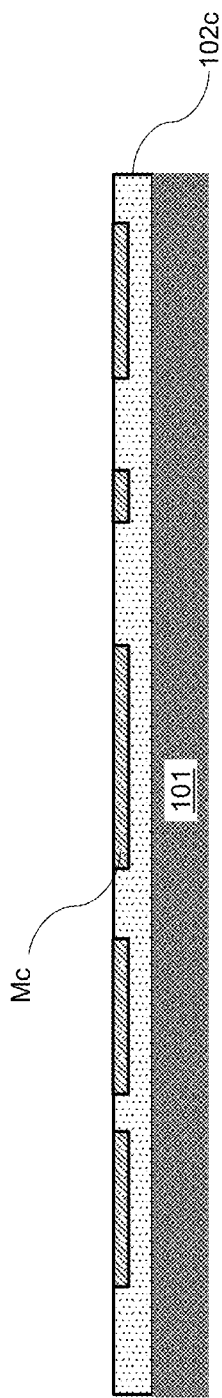
FIG. 3A is a vertical cross-sectional view of an exemplary intermediate structure in which a third dielectric layer is formed on a substrate, according to one or more embodiments.

FIG. 3A illustrates an exemplary intermediate structure in which a third dielectric layer 102c is formed on a substrate 101, according to one or more embodiments. The third dielectric layer 102c may be formed by any suitable method known in the art. In particular, the third dielectric layer 102c may be formed by depositing a dielectric material such as an ELK dielectric material on a surface of the substrate 101. The ELK dielectric material may be deposited, for example, by chemical vapor deposition (CVD), plasma enhanced chemical vapor deposition (PECVD), physical vapor deposition (PVD), spin coating, lamination or other suitable deposition technique.

The ELK dielectric material may include, for example, a dense layer of a carbon-doped oxygen-rich silicon oxide material. The dense layer of a carbon-doped oxygen-rich silicon oxide material may have a carbon content within a range of about 5 at. % to 30 at. %, an oxygen content within a range of about 40 at. % to 55 at. %, and a silicon content within a range of about 30 at. % to 40 at. %. The ELK dielectric material may be much denser than a traditional LK material and can have a hardness within a range of about 3 GPa to 10 GPa.

The ELK dielectric material may be deposited, for example, using a low flow rate of a precursor in a PECVD or a PVD process. The precursor may include, for example, methyl-diethoxymethylsilane (mDEOS). The low flow rate may be less than about 900 standard cubic centimeters per minute (sccm). The PECVD or PVD process may also employ a low precursor-to-carrier gas flow rate ratio. The carrier gas may include helium (He) and the low precursor-to-carrier gas flow rate ratio may be less than about 0.4. Different carrier gases and different precursor-to-carrier gas flow rate ratio may also be used. The ELK dielectric material may be deposited so as to provide a thickness of the third dielectric layer 102c in a range of about 20 nm to 100 nm.

The third metal layers Mc may then be formed in the third dielectric layer 102c. A hard mask may be formed and patterned over the third dielectric layer 102c The hard mask may include titanium nitride (TiN), although other hard mask materials may be used. The hard mask can be deposited using a CVD or PVD method, in some embodiments. The hard mask can be patterned, for example, by etching (e.g., wet etching, dry etching). The third dielectric layer 102c may then be etched using the patterned hard mask to transfer the pattern of the hard mask to the surface of the third dielectric layer 102c (e.g., form trenches or recessed portions) in the surface of the third dielectric layer 102c).

A metal layer (e.g., aluminum (Al), copper (Cu), etc.) may then be deposited on the surface of the third dielectric layer 102c and in the trenches or recessed portions of the pattern. The metal layer may be deposited using a vapor phase deposition (VPD) process such as an electron beam VPD (EBVPD) process, PVD, CVD or electroplating. Other deposition methods can be used to form the metal layer. A planarization process such as a chemical-mechanical planarization (CMP) can be used to planarize a surface of the metal layer with the surface of the third dielectric layer 102c, as illustrated in FIG. 3A.

Figure 3B:
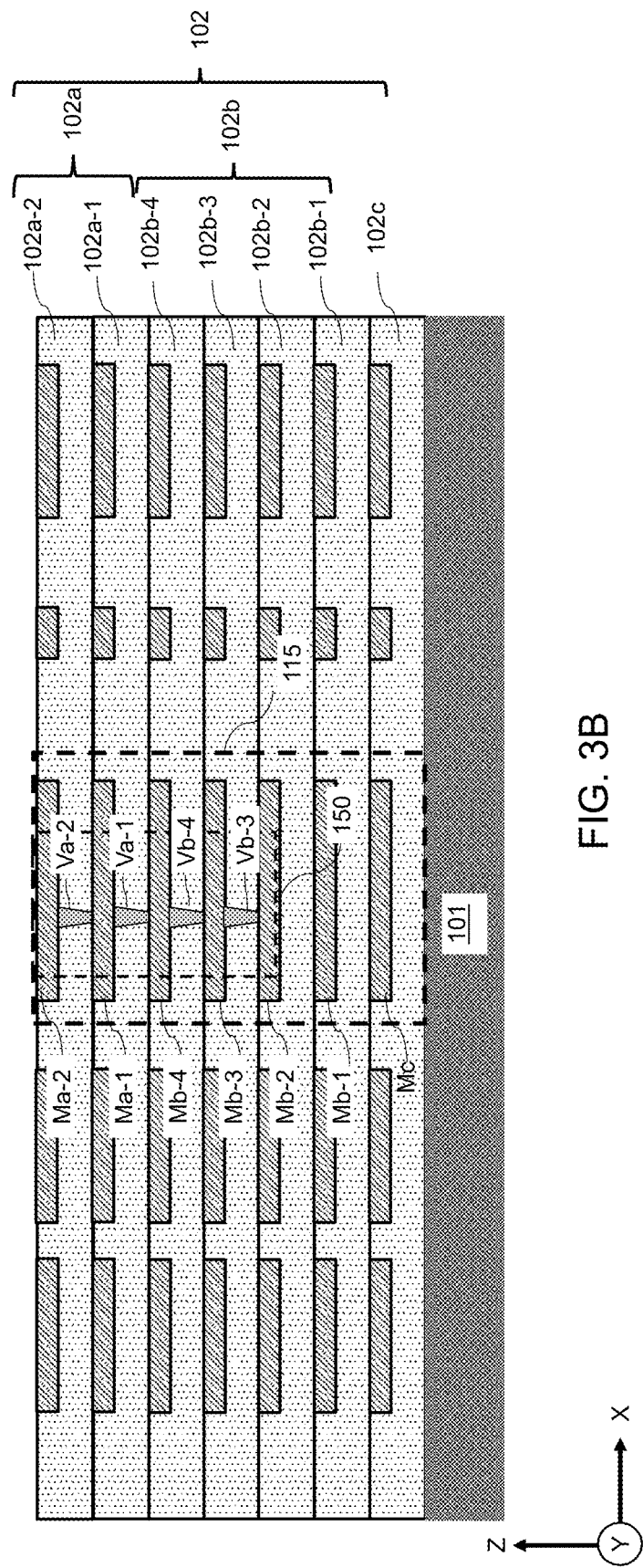
FIG. 3B is a vertical cross-sectional view of an exemplary intermediate structure in which the remaining layers of the dielectric layer stack are formed, according to one or more embodiments.

FIG. 3B illustrates an exemplary intermediate structure in which the remaining layers of the dielectric layer stack 102 are formed, according to one or more embodiments. In particular, the method of forming the third dielectric layer 102c that is described above, may be used to form the remaining layers of the dielectric layer stack 102. That is, the second dielectric layers 102b-1, 102b-2, 102b-3 and 102b-4 may be individually formed in that order on the third dielectric layer 102c. The second metal layers Mb-1, Mb-2, Mb-3 and Mb-4 may also be individually formed in the second dielectric layers 102b-1, 102b-2, 102b-3 and 102b-4, respectively. The first dielectric layers 102a-1, 102a-2 may be individually formed in that order on the second dielectric layer 102b-4. The first metal layers Ma-1, Ma-2 may also be individually formed in the second dielectric layers 102a-1, 102a-2, respectively.

The second vias Vb-3, Vb-4 may be formed in the same step as the forming of the second metal layers Mb-3, Mb-4, respectively. The second vias Va-1, Va-2 may be formed in the same step (e.g., in a dual damascene process) as the forming of the first metal layers Ma-1, Ma-2, respectively.

During the forming of the second vias Vb-3, Vb-4, Va-1, Va-2, care may be taken to comply with the constraints on the configuration of vias in the via stack 150 in the via stack checking region 115. The location of the via stack checking region 115 may be a location under the upper dielectric layer opening 119 which may be known at the time of forming the dielectric layer stack 102.

That is, under the first constraint, a total number of vias formed in the via stack 150 may be greater than or equal to 2. Under the second constraint, a number of the first vias (Va-1, Va-2) formed in the via stack 150 may be less than or equal to the number of second vias (Vb-3, Vb-4) formed in the via stack 150. Under the third constraint, a number of the second vias (Vb-3, Vb-4) formed in the via stack 150 may be less than or equal to 3. Under the fourth constraint (not shown in FIG. 3B), when the via stack 150 includes 3 second vias (Vb) and there are more than 3 second metal layers (Mb) in the stacked dielectric layers 102, then the uppermost second via (Vb_top) may not be formed as a stacked second via (Vb) (e.g., may not be formed in the via stack 150).

Figure 3C:
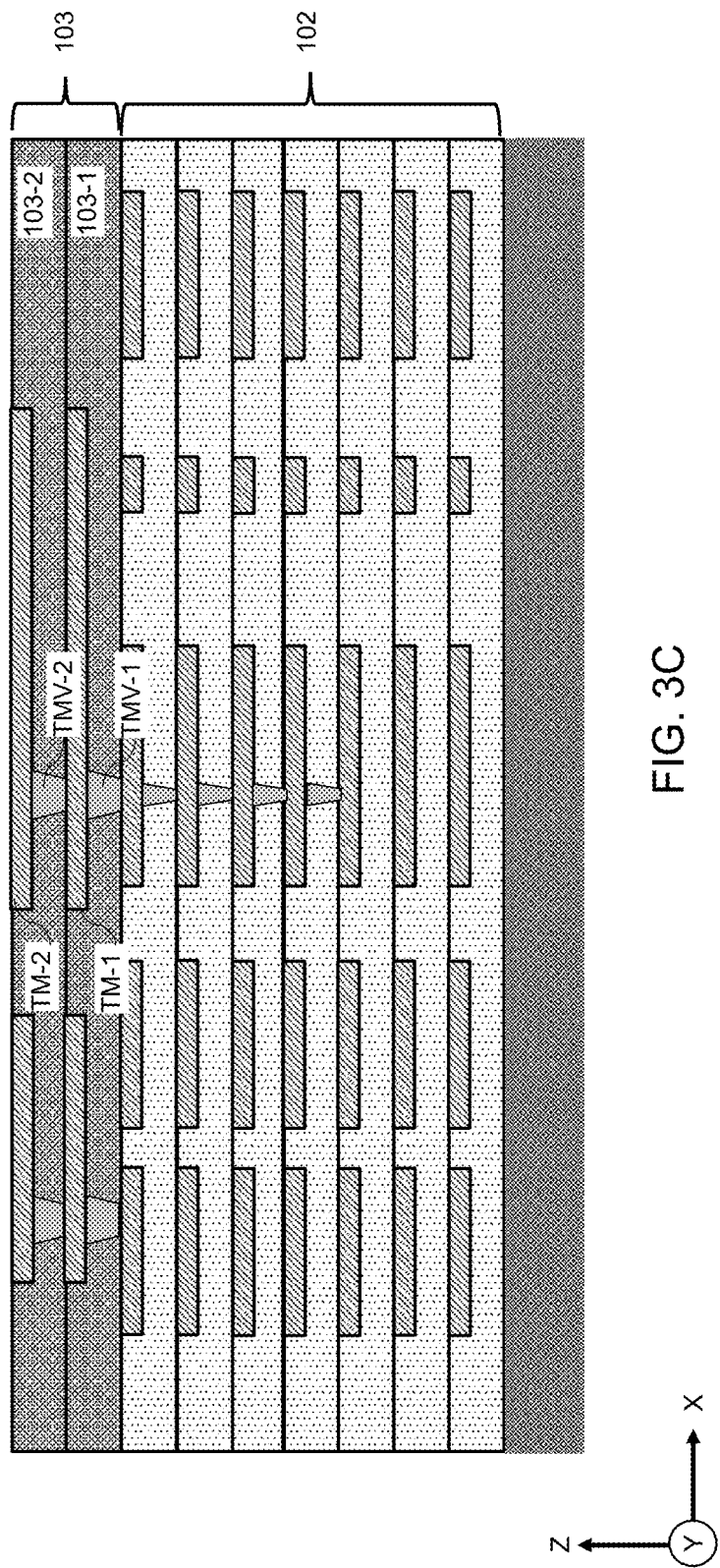
FIG. 3C is a vertical cross-sectional view of an exemplary intermediate structure in which the top dielectric structure is formed on the dielectric layer stack, according to one or more embodiments.

FIG. 3C illustrates an exemplary intermediate structure in which the top dielectric structure 103 is formed on the dielectric layer stack 102, according to one or more embodiments. The first top dielectric layer 103-1 may be formed by depositing a top dielectric material on the dielectric layer stack 102. The top dielectric material may include a low-k dielectric material. In one or more embodiments, the top dielectric material may include a similar dielectric material as in the dielectric layer stack 102. The top dielectric material may be deposited by CVD, PVD, etc.

The first top dielectric layer 103-1 may then be etched (e.g., wet etched, dry etched) to form a pattern of trenches or recessed portions. A metal layer (e.g., copper, copper alloys, aluminum, silver, gold and any combinations thereof) may then be deposited (e.g., by CVD, PVD, etc.) on the surface of first top dielectric layer 103-1 and in the trenches or recessed portions to form the top metal connector TM-1 and the top metal via TMV-1 (e.g., in a dual damascene process). The metal layer may then be planarized (e.g., by CMP) so that an upper surface of the top metal connector TM-1 is substantially co-planar with an upper surface of the first top dielectric layer 103-1. The second top dielectric layer 103-2 including the top metal connector TM-2 and the top metal via TMV-2, may then be formed on the first top dielectric layer 103-1 by a process similar to the process of forming the first top dielectric layer 103-1.

Figure 3D:
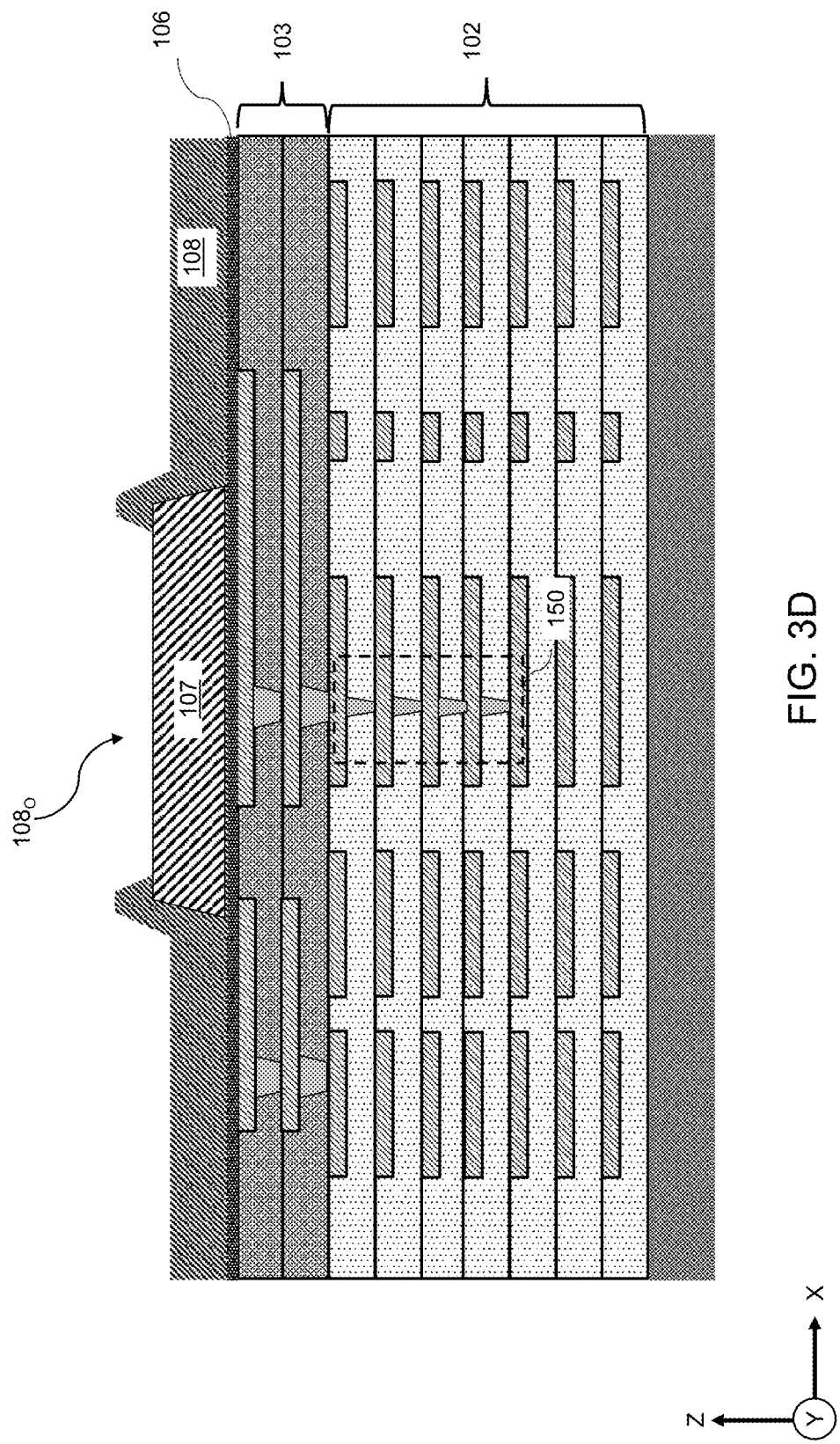
FIG. 3D is a vertical cross-sectional view of an exemplary intermediate structure in which the upper metal layer may be formed, according to one or more embodiments.

FIG. 3D illustrates an exemplary intermediate structure in which the upper metal layer 107 may be formed, according to one or more embodiments. A first passivation material (e.g., un-doped silicate glass, silicon nitride, silicon oxide, low-k dielectric material or ELK dielectric material) may be deposited (e.g., by CVD, PVD) on the top dielectric structure 103 to form the first passivation layer 106.

A metal layer (e.g., aluminum) may then be deposited (e.g., by CVD, PVD) on the first passivation layer 106. The metal layer may be formed to have a thickness in a range from about 1 μm to 50 μm. A mask pattern may then be formed on the metal layer, and the metal layer etched (e.g., wet etched, dry etched) through the mask pattern to form the upper metal layer 107. The upper metal layer 107 may be formed so that a center of the upper metal layer 107 may be substantially aligned in a Z-direction with the via stack 150.

A second passivation material (e.g., un-doped silicate glass, silicon nitride, silicon oxide, low-k dielectric material or ELK dielectric material) may then be deposited (e.g., by CVD, PVD) on the first passivation layer 106 and on the upper metal layer 107. The second passivation material may be deposited so as to have a thickness that is substantially similar to a thickness of the upper metal layer 107.

The second passivation layer 108 may be patterned to include an opening $108_o$ over the upper metal layer 107. The opening $108_o$ may be formed to have a width that is less than a width of the upper metal layer 107, so that the central portion of the upper surface may be exposed through the opening $108_o$. The outer perimeter of the upper surface of the upper metal layer 107 may remain covered by the second passivation layer 108.

Figure 3E:
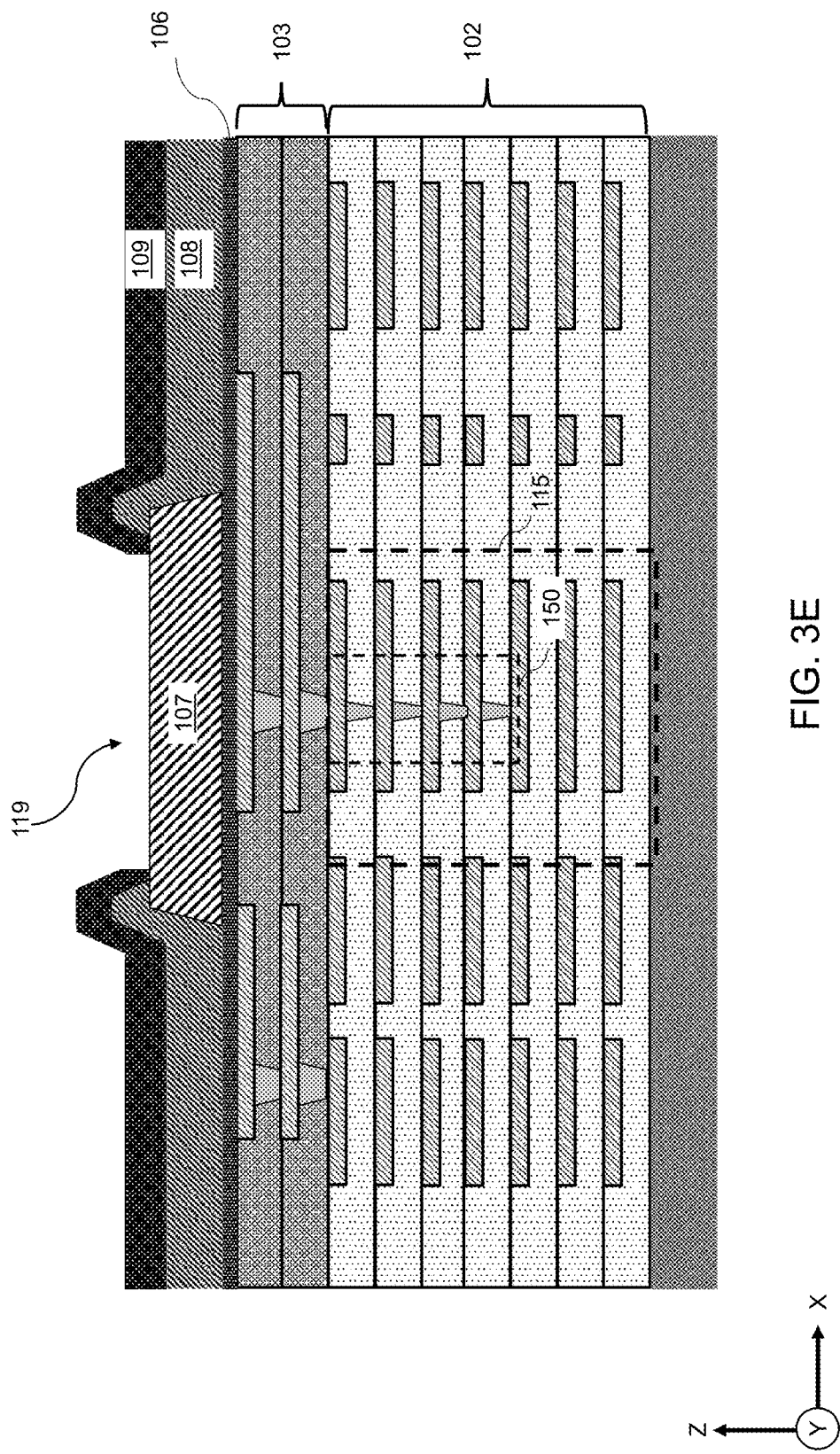
FIG. 3E is a vertical cross-sectional view of an exemplary intermediate structure in which the upper dielectric layer may be formed, according to one or more embodiments.

FIG. 3E illustrates an exemplary intermediate structure in which the upper dielectric layer 109 may be formed, according to one or more embodiments. The upper dielectric layer 109 may be formed by depositing an upper dielectric material (e.g., benzocyclobutene (BCB) polymer, polyimide (PI), polybenzoxazole (PBO) or a combination thereof) on the second passivation layer 108 and in the opening $108_o$ of the second passivation layer 108 on the upper surface of the upper metal layer 107. The upper dielectric material may be conformally deposited on the second passivation layer 108. Thus, a shape of the upper dielectric layer 109 may follow a shape of the second passivation layer 108 around the outer perimeter of the upper surface of the upper metal layer 107. The upper dielectric layer 109 may then be patterned to form the upper dielectric layer opening (UDLO) 119 so that the upper surface of the upper metal layer 107 may be exposed through the UDLO 119. The via stack checking region 115 may then be identified as the region of the dielectric layer stack 102 that is under the UDLO 119.

Figure 3F:
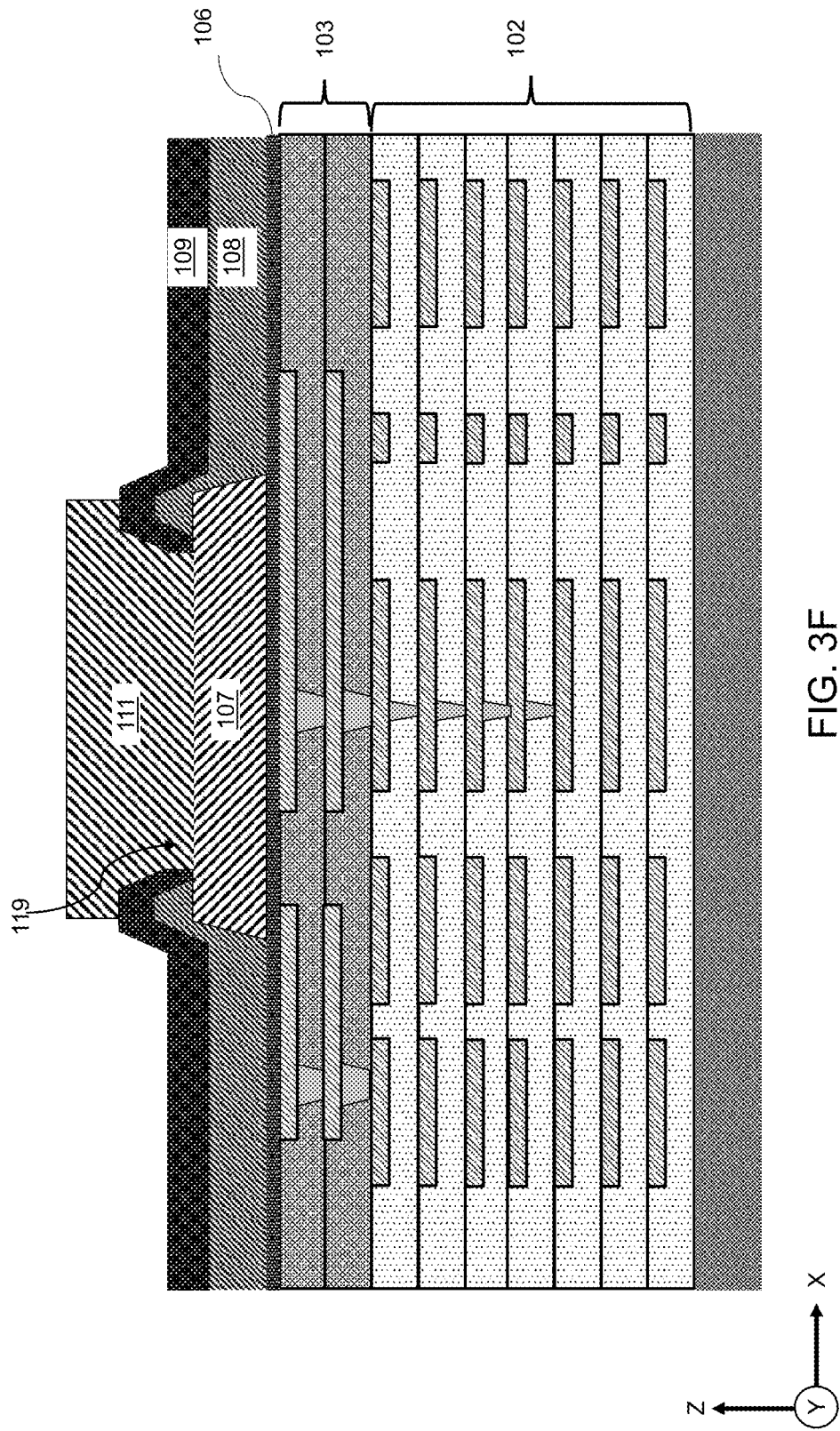
FIG. 3F is a vertical cross-sectional view of an exemplary intermediate structure in which the metal bump may be formed, according to one or more embodiments.

FIG. 3F illustrates an exemplary intermediate structure in which the metal bump 111 may be formed, according to one or more embodiments. The metal bump 111 may be formed on the upper metal layer 107 in the UDLO 119. Prior to forming the metal bump 111, the UBM (not shown) including a diffusion barrier layer and a seed layer) may be conformally formed on the upper surface of the upper metal layer 107 in the UDLO 119.

The metal bump 111 (e.g., copper pillar) may be formed in the UDLO 119 and contact the upper surface of the upper metal layer 107 (or contact the upper surface of the UBM, if applicable). The metal bump 111 may include, for example, a copper pillar that may be formed by sputtering, electroplating or photolithography. Alternatively, the metal bump 111 may include a solder ball. The solder ball may be formed in the UDLO 119, for example, by an automated pick-and-place machine using vacuum suction.

Figure 4:
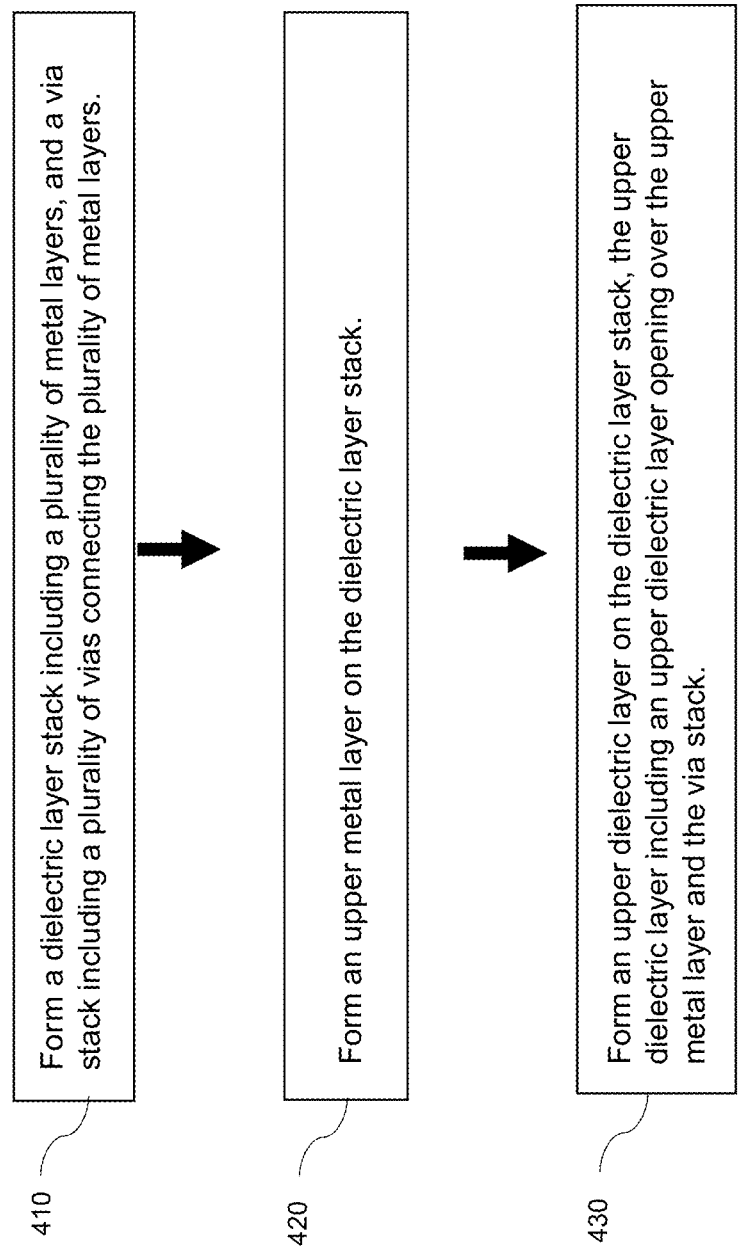
FIG. 4 is a flow chart illustrating a method of making the electrical connection structure according to one or more embodiments.

FIG. 4 is a flow chart illustrating a method of making the electrical connection structure 100 according to one or more embodiments. Step 410 of the method may include forming a dielectric layer stack including a plurality of metal layers, and a via stack including a plurality of vias connecting the plurality of metal layers. Step 420 of the method may include forming an upper metal layer on the dielectric layer stack. Step 430 of the method may include forming an upper dielectric layer on the dielectric layer stack, the upper dielectric layer including an upper dielectric layer opening over the upper metal layer and the via stack. In the forming of the dielectric layer stack of Step 410, a configuration of the vias in the via stack may be constrained by the following: a number of first vias in the plurality of vias, that are above second vias in the plurality of vias may be less than or equal to a number of the second vias, and the number of second vias in the plurality of vias is less than or equal to 3.

Figure 5:
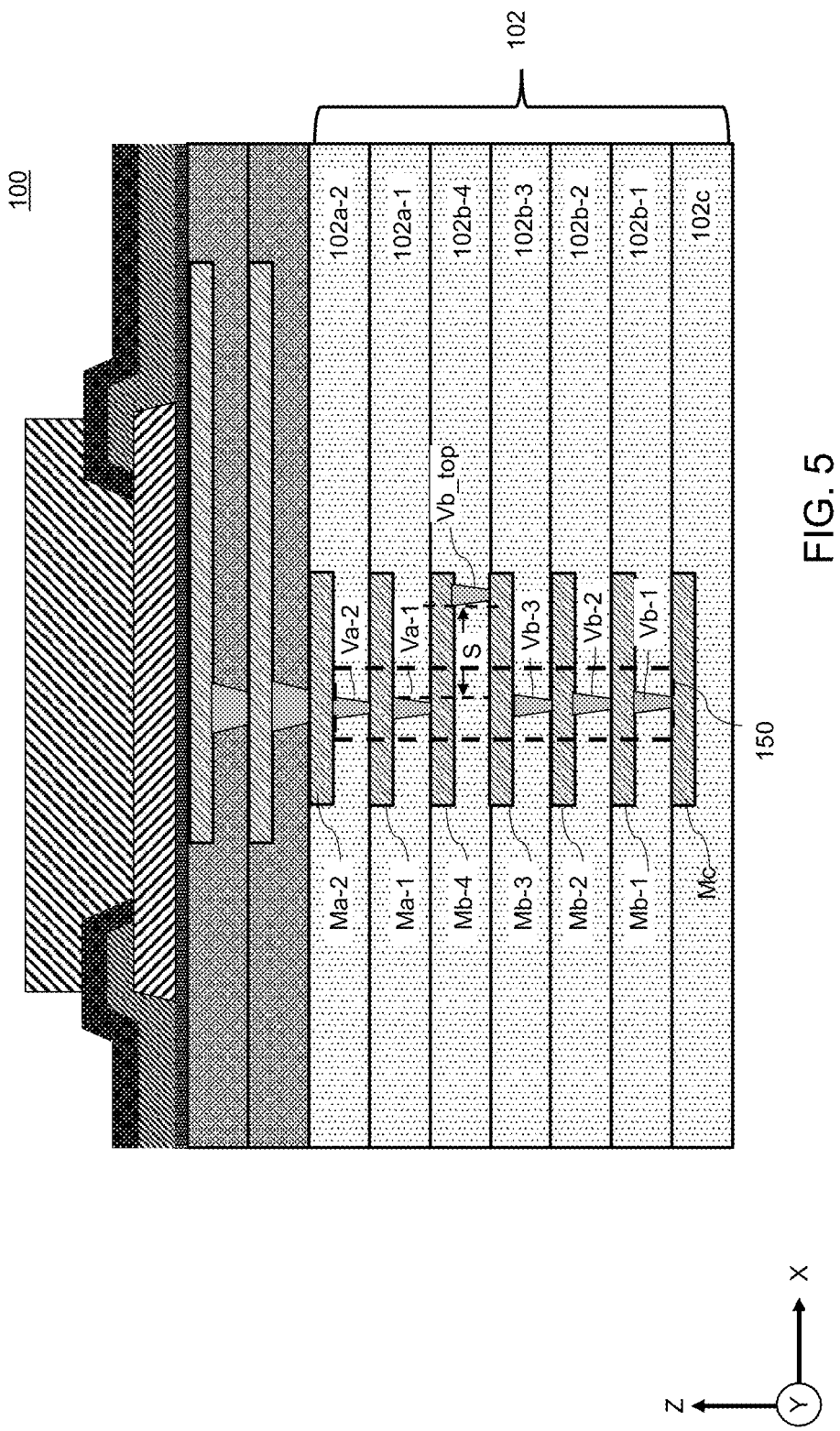
FIG. 5 is a vertical cross-sectional view of a first alternate design of the electrical connection structure according to one or more embodiments.

FIG. 5 is a vertical cross-sectional view of a first alternate design of the electrical connection structure 100 according to one or more embodiments. In the first alternate design, the dielectric layer stack 102 includes a via stack 150 that includes a second via Vb-1 in the second dielectric layer 102b-1, a second via Vb-2 in the second dielectric layer 102b-2, a second via Vb-3 in the second dielectric layer 102b-3, a first via Va-1 in the first dielectric layer 102a-1 and a first via Va-2 in the first dielectric layer 102a-2.

The dielectric layer stack 102 also include a via Vb_top in the second dielectric layer 102b-4 (the uppermost second dielectric layer). However, the via Vb_top is separated from the first via Va-1 by a distance S that is greater than 26.5 nm. Therefore, according to the via stack above (e.g., see FIGS. 2A and 2B), the via Vb_top is not a part of the via stack 150.

Thus, the first alternate design in FIG. 5 meets the four constraints on the configuration of the via stack 150. That is, a total number of vias in the via stack 150 (i.e., 5) is greater than or equal to 2 (first constraint), a number of the first vias in the via stack 150 (i.e., 2) is less than or equal to the number of second vias (i.e., 3) in the via stack 150 (second constraint), and a number of the second vias in the via stack 150 (i.e., 3) is less than or equal to 3 (third constraint). In addition, as illustrated in FIG. 5, the via stack 150 includes 3 second vias, and there are more than 3 second metal layers in the stacked dielectric layers 102, but the uppermost second via (Vb_top) is not a stacked second via (Vb) (e.g., is not in the via stack 150) (fourth constraint).

Figure 6:
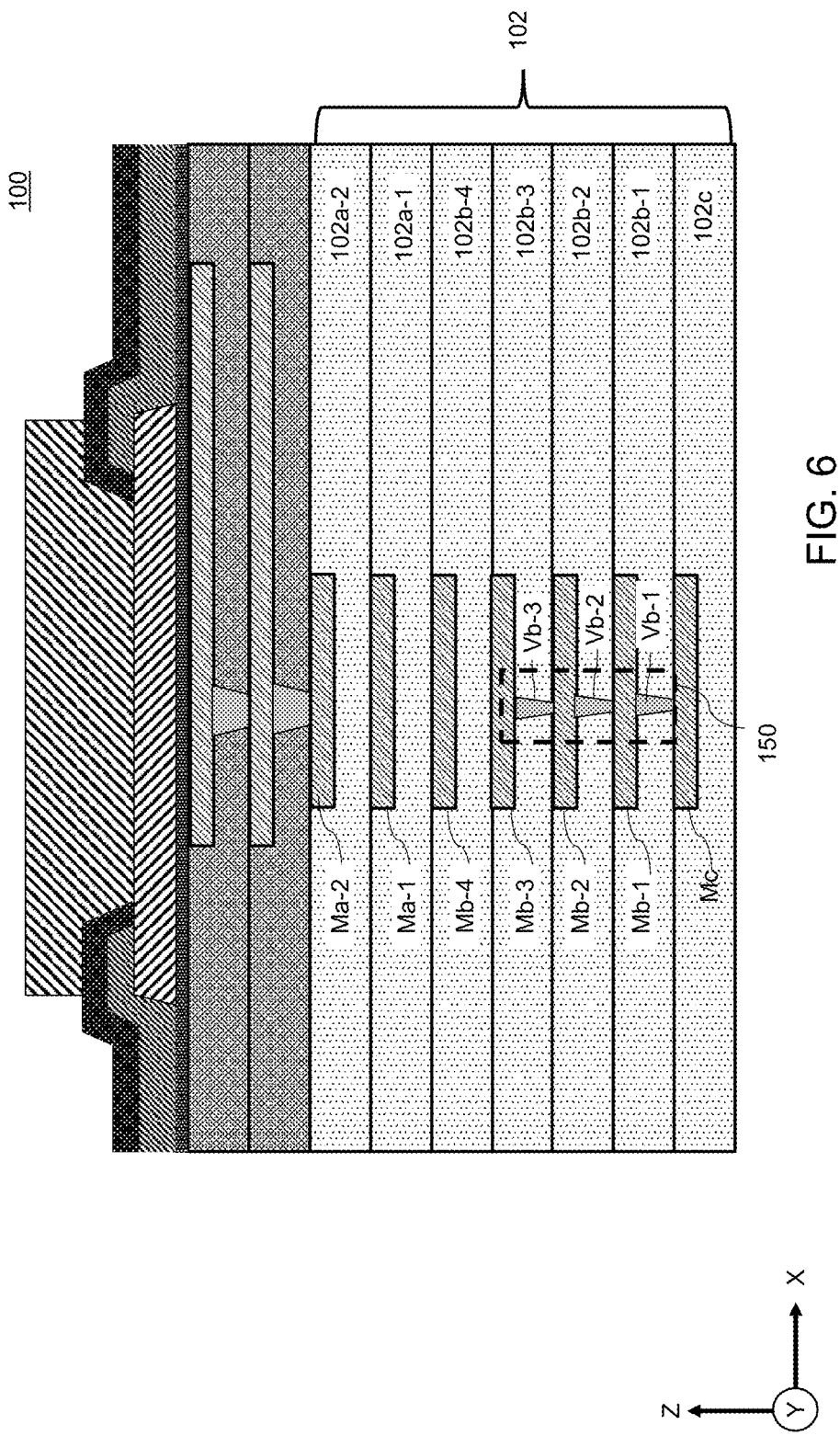
FIG. 6 is a vertical cross-sectional view of a second alternate design of the electrical connection structure according to one or more embodiments.

FIG. 6 is a vertical cross-sectional view of a second alternate design of the electrical connection structure 100 according to one or more embodiments. In the second alternate design, the dielectric layer stack 102 includes a via stack 150 that includes a second via Vb-1 in the second dielectric layer 102*b*-1, a second via Vb-2 in the second dielectric layer 102*b*-2, and a second via Vb-3 in the second dielectric layer 102*b*-3.

Thus, the second alternate design in FIG. 6 meets the first, second and third constraints on the configuration of the via stack 150. That is, a total number of vias in the via stack 150 (i.e., 3) is greater than or equal to 2 (first constraint), a number of the first vias in the via stack 150 (i.e., zero) is less than or equal to the number of second vias (i.e., 3) in the via stack 150 (second constraint), and a number of the second vias in the via stack 150 (i.e., 3) is less than or equal to 3 (third constraint). The fourth constraint is not applicable here because there is no second via (Vb_top) in the uppermost second dielectric layer 102*b*-4.

Figure 7:
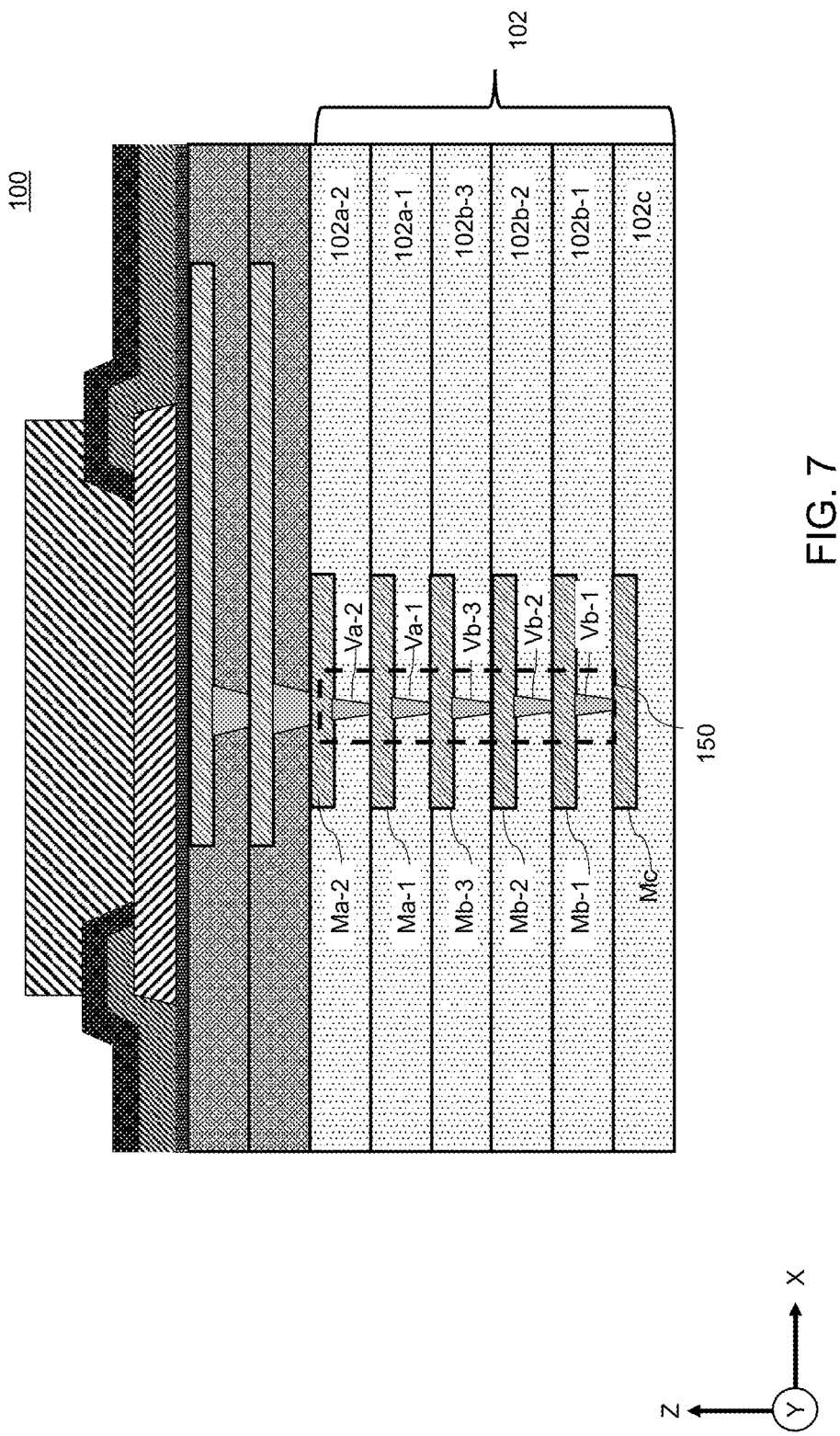
FIG. 7 is a vertical cross-sectional view of a third alternate design of the electrical connection structure according to one or more embodiments.

FIG. 7 is a vertical cross-sectional view of a third alternate design of the electrical connection structure 100 according to one or more embodiments. In the third alternate design, the dielectric layer stack 102 includes a via stack 150 that includes a second via Vb-1 in the second dielectric layer 102*b*-1, a second via Vb-2 in the second dielectric layer 102*b*-2, a second via Vb-3 in the second dielectric layer 102*b*-3, a first via Va-1 in the first dielectric layer 102*a*-1, and a first via Va-2 in the first dielectric layer 102*a*-2.

Thus, the third alternate design in FIG. 7 meets the first, second and third constraints on the configuration of the via stack 150. That is, a total number of vias in the via stack 150 (i.e., 5) is greater than or equal to 2 (first constraint), a number of the first vias in the via stack 150 (i.e., 2) is less than or equal to the number of second vias (i.e., 3) in the via stack 150 (second constraint), and a number of the second vias in the via stack 150 (i.e., 3) is less than or equal to 3 (third constraint). The fourth constraint is not applicable because the number of second metal layers in the dielectric layer stack 102 (i.e., 3) is not greater than 3.

Figure 8:
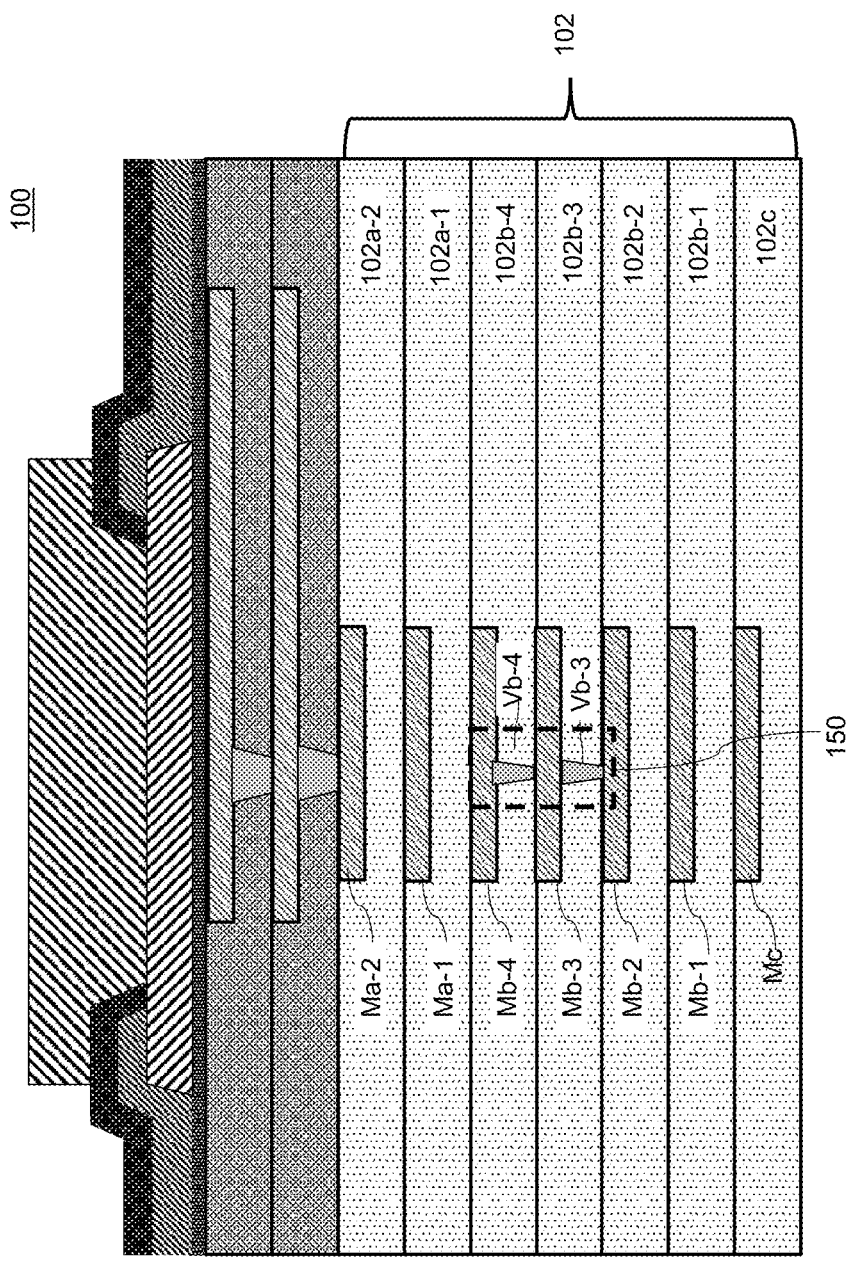
FIG. 8 is a vertical cross-sectional view of a fourth alternate design of the electrical connection structure according to one or more embodiments.

FIG. 8 is a vertical cross-sectional view of a fourth alternate design of the electrical connection structure 100 according to one or more embodiments. In the fourth alternate design, the dielectric layer stack 102 includes a via stack 150 that includes a second via Vb-3 in the second dielectric layer 102*b*-3, and a second via Vb-4 in the second dielectric layer 102*b*-4.

Thus, the fourth alternate design in FIG. 8 meets the first, second and third constraints on the configuration of the via stack 150. That is, a total number of vias in the via stack 150 (i.e., 2) is greater than or equal to 2 (first constraint), a number of the first vias in the via stack 150 (i.e., zero) is less than or equal to the number of second vias (i.e., 2) in the via stack 150 (second constraint), and a number of the second vias in the via stack 150 (i.e., 2) is less than or equal to 3 (third constraint). The fourth constraint is not applicable because the number of second vias (i.e., 2) is less than 3.

Figure 9:
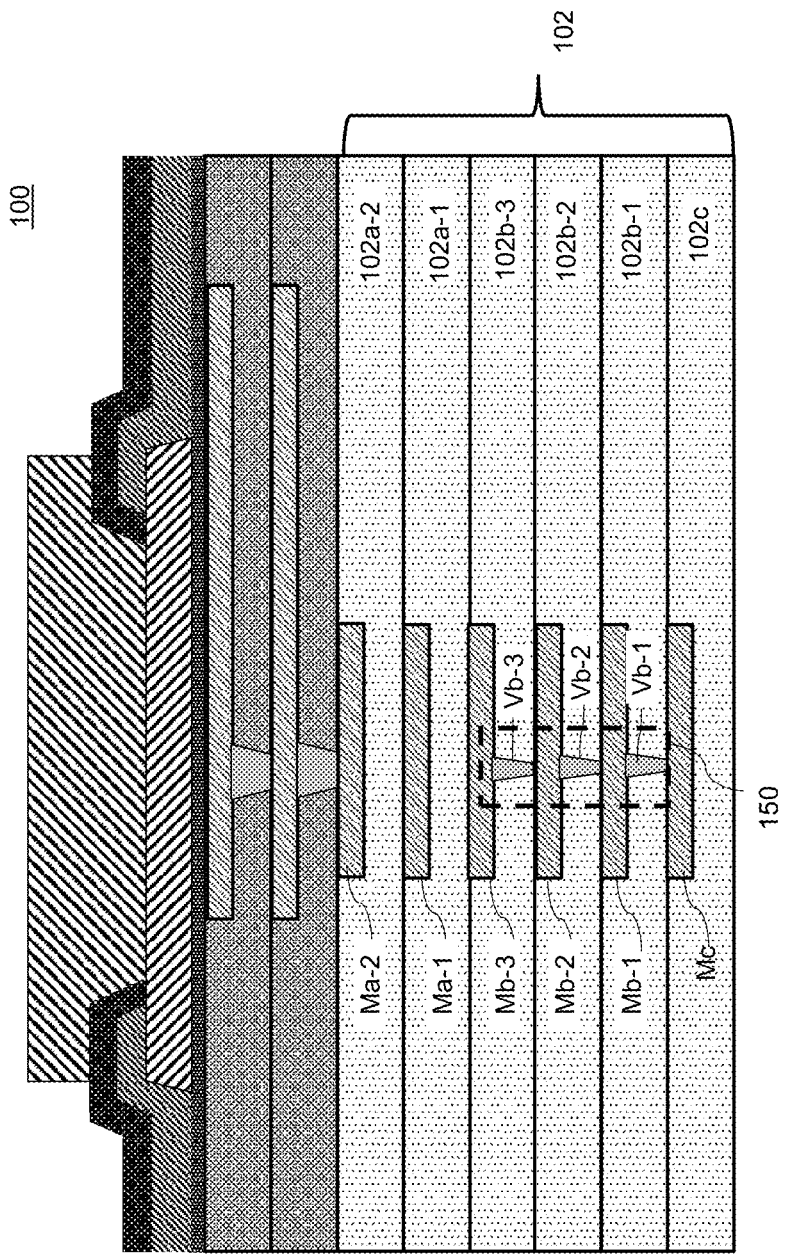
FIG. 9 is a vertical cross-sectional view of a fifth alternate design of the electrical connection structure according to one or more embodiments.

FIG. 9 is a vertical cross-sectional view of a fifth alternate design of the electrical connection structure 100 according to one or more embodiments. In the fifth alternate design, the dielectric layer stack 102 includes a via stack 150 that includes a second via Vb-1 in the second dielectric layer 102*b*-1, second via Vb-2 in the second dielectric layer 102*b*-2, and a second via Vb-3 in the second dielectric layer 102*b*-3.

Thus, the fifth alternate design in FIG. 9 meets the first, second and third constraints on the configuration of the via stack 150. That is, a total number of vias in the via stack 150 (i.e., 3) is greater than or equal to 2 (first constraint), a number of the first vias in the via stack 150 (i.e., zero) is less than or equal to the number of second vias (i.e., 3) in the via stack 150 (second constraint), and a number of the second vias in the via stack 150 (i.e., 3) is less than or equal to 3 (third constraint). The fourth constraint is not applicable because the number of second metal layers in the dielectric layer stack 102 (i.e., 3) is not greater than 3.

Figure 10:
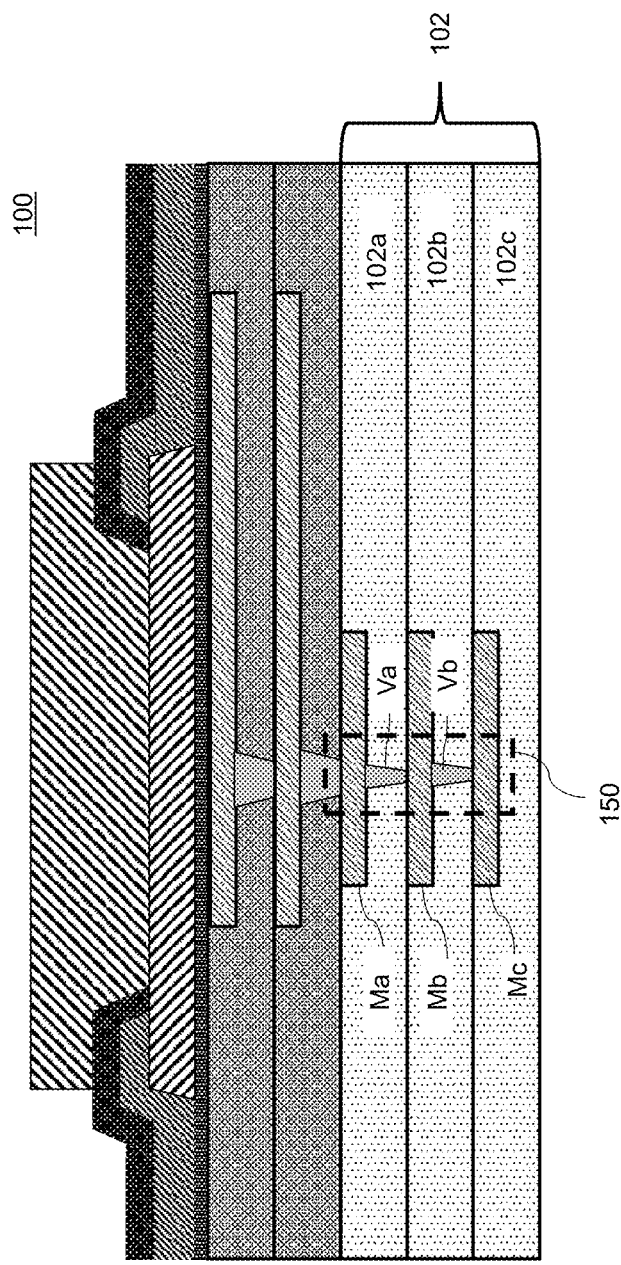
FIG. 10 is a vertical cross-sectional view of a sixth alternate design of the electrical connection structure according to one or more embodiments.

FIG. 10 is a vertical cross-sectional view of a sixth alternate design of the electrical connection structure 100 according to one or more embodiments. In the sixth alternate design, the dielectric layer stack 102 may include a first dielectric layer 102*a*, a second dielectric layer 102*b* and a third dielectric layer 102*c*. The dielectric layer stack 102 may further include a first metal layer Ma in the first dielectric layer 102*a*, a second metal layer Mb in the second dielectric layer 102*b*, and a third metal layer Mc in the third dielectric layer 102*c*. The dielectric layer stack 102 may further include a via stack 150 that includes a first via Va in the first dielectric layer 102*a* and a second via Vb in the second dielectric layer 102*b*. The first via Va and second via Vb may electrically connect the first metal layer Ma, second metal layer Mb and third metal layer Mc.

Thus, the sixth alternate design in FIG. 10 may meet the first, second and third constraints on the configuration of the via stack 150. That is, a total number of vias in the via stack 150 (i.e., 2) is greater than or equal to 2 (first constraint), a number of the first vias in the via stack 150 (i.e., 1) is less than or equal to the number of second vias (i.e., 1) in the via stack 150 (second constraint), and a number of the second vias in the via stack 150 (i.e., 1) is less than or equal to 3 (third constraint). The fourth constraint is not applicable because the number of second metal layers in the dielectric layer stack 102 (i.e., 1) is not greater than 3.

Figure 11:
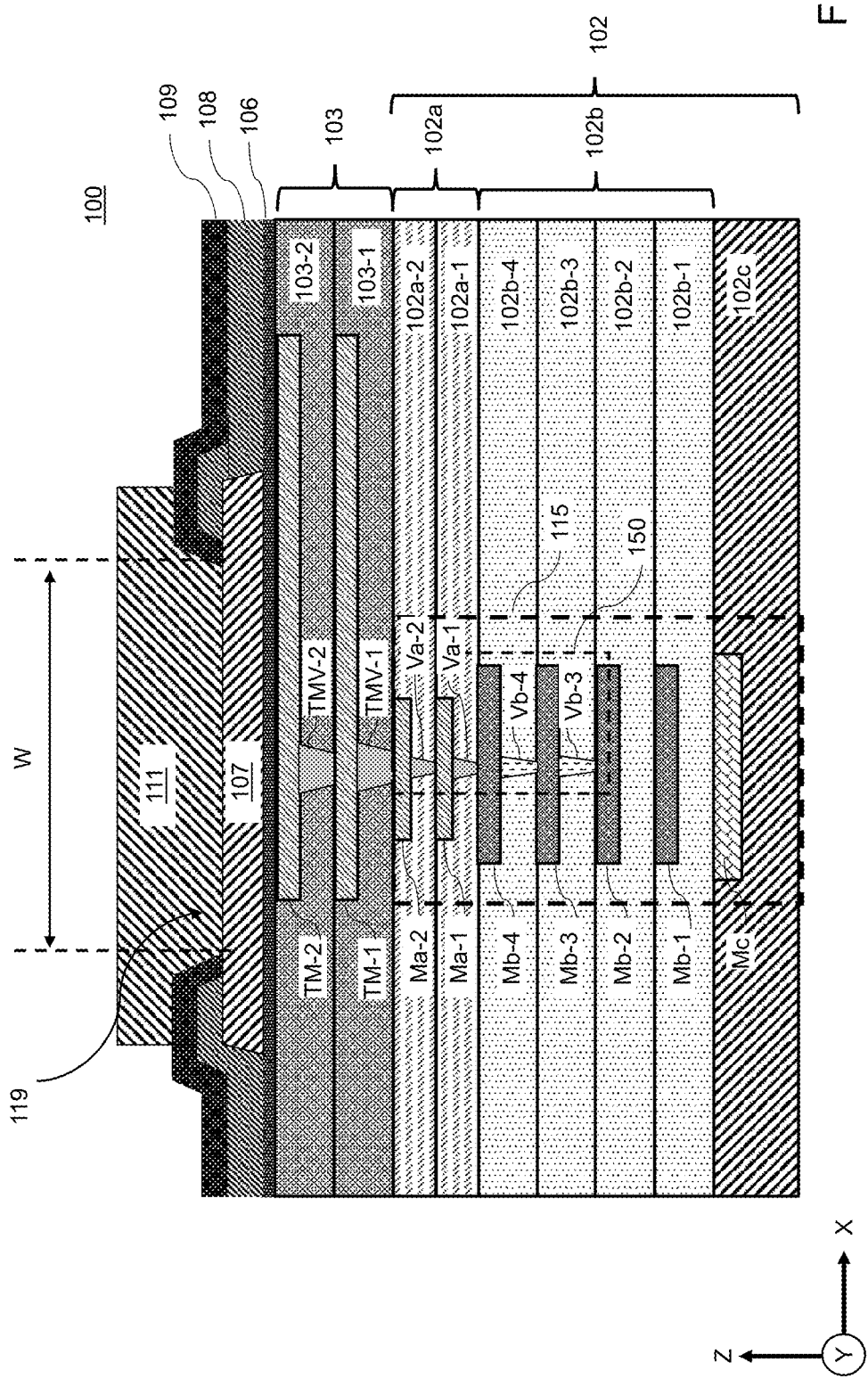
FIG. 11 is a vertical cross-sectional view of a seventh alternate design of the electrical connection structure according to one or more embodiments.

FIG. 11 is a vertical cross-sectional view of a seventh alternate design of the electrical connection structure 100 according to one or more embodiments. In the sixth alternate design, the first dielectric layers 102*a* may be composed of a first material (e.g., first ELK material). The second dielectric layers 102*b* may be composed of a second material (e.g., second ELK material) different than the first material. The third dielectric layer 102*c* may be composed of a third material (e.g., third ELK material) different than the first material and/or the second material. In particular, the first material may have a first dielectric constant, the second material may have a second dielectric constant that is greater than or less than the first dielectric constant, and the third material may have a third dielectric constant that is greater than or less than the first dielectric constant and/or the second dielectric constant.

The first dielectric layers 102*a* may have a first thickness (e.g., in the z-direction) and the second dielectric layers 102*b* may have a second thickness that is greater than or less than the first thickness. The third dielectric layer 102*c* may have a third thickness that is greater than or less than the first thickness and/or the second thickness. As illustrated in FIG. 11, for example, the second thickness may be greater than the first thickness, and the third thickness may be greater than the second thickness.

The first vias Va-1 and Va-2 in the first dielectric layers 102a may include a first via material and the second vias Vb-3 and Vb-4 in the second dielectric layers 102b may include a second via material that is different than the first via material. The third dielectric layer 102c may include third vias including a third via material that is different than first via material and/or the second via material. The first vias Va-1 and Va-2 may also have a first via shape and the second vias Vb-3 and Vb-4 may have a second via shape that is different than the first via shape. The third vias in the third dielectric layer 102c may have a third via shape that is different than the first via shape and/or the second via shape.

The first vias Va-1 and Va-2 may also have a first via size (e.g., in the x-direction, y-direction and/or z-direction) and the second vias Vb-3 and Vb-4 may have a second via size that is greater than or less than the first via size. The third vias in the third dielectric layer 102c may have a third via size that is greater than or less than the first via size and/or the second via size. As illustrated in FIG. 11, for example, a second via thickness in the z-direction may be greater than a first via thickness in the z-direction.

The first metal layers Ma-1 and Ma-2 in the first dielectric layers 102a may include a first metal layer material and the second metal layers Ma-1, Ma-2, Ma-3 and Ma-4 in the second dielectric layers 102b may include a second metal layer material that is different than the first metal layer material. The third metal layer Mc in the third dielectric layer 102c may include a third metal layer material that is different than first metal layer material and/or the second metal layer material. The first metal layers Ma-1 and Ma-2 may also have a first metal layer shape and the second metal layers Ma-1, Ma-2, Ma-3 and Ma-4 may have a second metal layer shape that is different than the first metal layer shape. The third metal layer Mc may have a third metal layer shape that is different than the first metal layer shape and/or the second metal layer shape.

The first metal layers Ma-1 and Ma-2 may also have a first metal layer size (e.g., in the x-direction, y-direction and/or z-direction) and the second metal layers Ma-1, Ma-2, Ma-3 and Ma-4 may have a second metal layer size that is greater than or less than the first metal layer size. The third metal layer Mc may have a third metal layer size that is greater than or less than the first metal layer size and/or the second metal layer size. As illustrated in FIG. 11, for example, a second metal layer thickness in the z-direction may be greater than a first metal layer thickness in the z-direction and a third metal layer thickness in the z-direction may be greater than the second metal layer thickness in the z-direction. As also illustrated in FIG. 11, for example, a second metal layer length in the x-direction may be greater than a first metal layer length in the x-direction and a third metal layer length in the x-direction may be greater than the second metal layer length in the x-direction.

Figure 12:
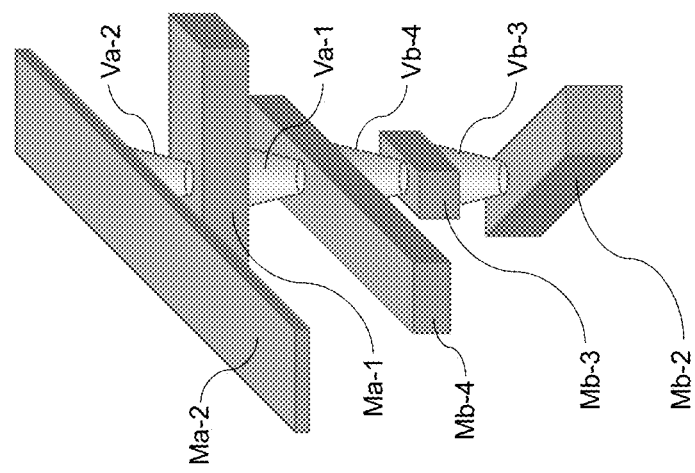
FIG. 12 is a partial perspective view of the metal layers and vias in the first dielectric layers and second dielectric layers according to one or more embodiments.

FIG. 12 is a partial perspective view of the metal layers and vias in the first dielectric layers 102a and second dielectric layers 102b according to one or more embodiments. The material and thicknesses of the first dielectric layers 102a may remain uniform throughout the first dielectric layers 102a. However, the first vias Va-1 and Va-2 may vary in terms of material, size and/or shape, and the first metal layers Ma-1 and Ma-2 may vary in terms of material, size and/or shape. Similarly, the material and thicknesses of the second dielectric layers 102b may remain uniform throughout the second dielectric layers 102b. However, the second vias Vb-3 and Vb-4 may vary in terms of material, size and/or shape, and the second metal layers Mb-1, Mb-2, Mb-3 and Mb-4 may vary in terms of material, size and/or shape.

Further, as illustrated in FIG. 12, the metal layers in the first dielectric layers 102a and second dielectric layers 102b may extend longitudinally in different directions. The lengths of Ma-1, Ma-2, Mb-2, Mb-3 and Mb-4 (and Mc which is not shown) in a cross-sectional view may be related to their longitudinal directions. Thus, a length of Ma-1, Ma-2, Mb-2, Mb-3 and Mb-4 (and Mc) in a cross-sectional view may be different.

A via crack or delamination may be caused by a shifting of a via in the via stack 150 (e.g., a via shift in the via stack 150). The via shift may be related to a direction (e.g., longitudinal direction) of the metal layers that are connected to the vias in the via stack 150. For example, a via may be more likely to shift along a longitudinal direction of one or more of the metal layers to which the via is connected. The constrained configuration of the stacked vias in the via stack 150 may help to inhibit via shift and may, therefore, mitigate against a via crack or via delamination in the first dielectric layers 102a and second dielectric layers 102b.

Referring to FIGS. 1A-12, an electrical connection structure 100 may include a dielectric layer stack 102 including a plurality of dielectric layers 102a, 102b, 102c including a first dielectric layer 102a as an uppermost layer, and a second dielectric layer 102b under the first dielectric layer 102a, a plurality of metal layers (Ma-1, Ma-2, Mb-1, Mb-2, Mb-3, Mb-4, Mc) in the plurality of dielectric layers 102a, 102b, 102c, a via stack 150 in the plurality of dielectric layers 102a, 102b, 102c and including a plurality of vias (Va-1, Va-2, Vb-1, Vb-2, Vb-3, Vb-4) connecting the plurality of metal layers (Ma-1, Ma-2, Mb-1, Mb-2, Mb-3, Mb-4, Mc), an upper metal layer 107 on the dielectric layer stack 102 over the via stack 150, and an upper dielectric layer 109 on the dielectric layer stack 102 and including an upper dielectric layer opening 119 over the upper metal layer 107 and the via stack 150. A number of first vias Va of the plurality of vias (Va-1, Va-2, Vb-1, Vb-2, Vb-3, Vb-4) in the first dielectric layer 102a, may be less than or equal to a number of second vias Vb of the plurality of vias (Va-1, Va-2, Vb-1, Vb-2, Vb-3, Vb-4) in the second dielectric layer 102b, and the number of second vias Vb of the plurality of vias (Va-1, Va-2, Vb-1, Vb-2, Vb-3, Vb-4) in the second dielectric layer 102b may be less than or equal to 3. A number of first metal layers of the plurality of metal layers (Ma-1, Ma-2, Mb-1, Mb-2, Mb-3, Mb-4, Mc) in the first dielectric layer 102a may be 1 or more, a number of second metal layers of the plurality of metal layers (Ma-1, Ma-2, Mb-1, Mb-2, Mb-3, Mb-4, Mc) in the second dielectric layer 102b may be 1 or more, and the number of second metal layers may be greater than or equal to the number of first metal layers. The dielectric layer stack 102 may further include a third dielectric layer 102c under the second dielectric layer 102b, and a number of third metal layers (Mc) of the plurality of metal layers (Ma-1, Ma-2, Mb-1, Mb-2, Mb-3, Mb-4, Mc) in the third dielectric layer 102c may be equal to or greater than 1. The second metal layers Mb may include a second metal layer Mb having an area less than or equal to 0.0228 µm2. The second vias Vb in the via stack 150 may include an upper second via on an upper surface of the second metal layer Mb and a lower second via on a lower surface of the second metal layer Mb, and a distance between the upper second via and the lower second via may be less than or equal to 26.5 nm. The electrical connection structure 100 may further include a separated second via on a lower surface of an uppermost second metal layer of the second metal layers, the separated second via being separated from the via stack 150 by a distance greater than 26.5 nm. The number of second vias Vb in the plurality of vias (Va-1, Va-2, Vb-1, Vb-2, Vb-3, Vb-4) may be 3, and the number of second metal layers in the plurality of metal layers (Ma-1, Ma-2, Mb-1, Mb-2, Mb-3, Mb-4, Mc) may be greater than 3. The plurality of dielectric layers 102a, 102b, 102c may include a plurality of extreme low-k (ELK) dielectric layers, the first dielectric layer 102a may include a first ELK dielectric layer including a first material, and the second dielectric layer 102b may include a second ELK dielectric layer including a second material different than the first material. The plurality of dielectric layers 102a, 102b, 102c may include a plurality of extreme low-k (ELK) dielectric layers, the first dielectric layer 102a may include a first ELK dielectric layer having a first thickness, and the second dielectric layer 102b may include a second ELK dielectric layer having a second thickness different than the first thickness. The upper metal layer 107 may include a redistribution layer, and the upper dielectric layer 109 may include a polymer dielectric layer and the upper dielectric layer opening 119 may have a width less than a width of the redistribution layer. The electrical connection structure 100 may further include a metal bump 111 in the upper dielectric layer opening 119 and connected to the upper metal layer 107. The metal bump 111 may include one of a microbump interconnect structure or a C4 interconnect structure.

Referring to FIGS. 3A-4, a method of making an electrical connection structure 100 may include forming a dielectric layer stack 102 including a plurality of dielectric layers 102a, 102b, 102c including a first dielectric layer 102a as an uppermost layer, and a second dielectric layer 102b under the first dielectric layer 102a, a plurality of metal layers (Ma-1, Ma-2, Mb-1, Mb-2, Mb-3, Mb-4, Mc) in the plurality of dielectric layers 102a, 102b, 102c, and a via stack 150 in the plurality of dielectric layers 102a, 102b, 102c and including a plurality of vias (Va-1, Va-2, Vb-1, Vb-2, Vb-3, Vb-4) connecting the plurality of metal layers (Ma-1, Ma-2, Mb-1, Mb-2, Mb-3, Mb-4, Mc), forming an upper metal layer 107 on the dielectric layer stack 102, and forming an upper dielectric layer 109 on the dielectric layer stack 102, the upper dielectric layer 109 including an upper dielectric layer opening 119 over the upper metal layer 107 and the via stack 150. A number of first vias Va of the plurality of vias (Va-1, Va-2, Vb-1, Vb-2, Vb-3, Vb-4) in the first dielectric layer 102a, may be less than or equal to a number of second vias Vb of the plurality of vias (Va-1, Va-2, Vb-1, Vb-2, Vb-3, Vb-4) in the second dielectric layer 102b, and the number of second vias Vb of the plurality of vias (Va-1, Va-2, Vb-1, Vb-2, Vb-3, Vb-4) in the second dielectric layer 102b may be less than or equal to 3. The forming of the dielectric layer stack 102 may include forming the plurality of metal layers (Ma-1, Ma-2, Mb-1, Mb-2, Mb-3, Mb-4, Mc) such that a number of first metal layers of the plurality of metal layers (Ma-1, Ma-2, Mb-1, Mb-2, Mb-3, Mb-4, Mc) in the first dielectric layer 102a may be 1 or more, a number of second metal layers of the plurality of metal layers (Ma-1, Ma-2, Mb-1, Mb-2, Mb-3, Mb-4, Mc) in the second dielectric layer 102b may be 1 or more, and the number of second metal layers may be greater than or equal to the number of first metal layers. The forming of the dielectric layer stack 102 may further include forming the plurality of dielectric layers 102a, 102b, 102c to include a third dielectric layer 102c under the second dielectric layer 102b, and a number of third metal layers Mc of the plurality of metal layers (Ma-1, Ma-2, Mb-1, Mb-2, Mb-3, Mb-4, Mc) in the third dielectric layer 102c may be equal to or greater than 1. The forming of the dielectric layer stack 102 may include forming the plurality of metal layers (Ma-1, Ma-2, Mb-1, Mb-2, Mb-3, Mb-4, Mc) such that the second metal layers Mb may include a second metal layer Mb having an area less than or equal to 0.0228 μm2. The forming of the dielectric layer stack 102 may include forming the via stack 150 such that the second vias Vb include an upper second via on an upper surface of the second metal layer Mb and a lower second via on a lower surface of the second metal layer Mb, and a distance between the upper second via and the lower second via may be less than or equal to 26.5 nm. The method may further include forming a separated second via on a lower surface of an uppermost second metal layer of the second metal layers, the separated second via being separated from the via stack 150 by a distance greater than 26.5 nm. The number of second vias Vb in the plurality of vias (Va-1, Va-2, Vb-1, Vb-2, Vb-3, Vb-4) may be 3, and the number of second metal layers Mb in the plurality of metal layers (Ma-1, Ma-2, Mb-1, Mb-2, Mb-3, Mb-4, Mc) may be greater than 3. The forming of the dielectric layer stack 102 may include forming the plurality of dielectric layers 102a, 102b, 102c to include a plurality of extreme low-k dielectric layers, so that the first dielectric layer 102a may include a first ELK dielectric layer and the second dielectric layer 102b may include a second ELK dielectric layer. The first ELK dielectric layer may include a first material, and the second dielectric layer 102b may include a second material different than the first material or the first ELK dielectric layer may have a first thickness, and the second dielectric layer 102b may have a second thickness different than the first thickness. The method may further include forming a metal bump 111 in the upper dielectric layer opening 119 and connected to the upper metal layer 107. The upper dielectric layer 109 may include a polymer dielectric layer and the upper dielectric layer opening 119 may have a width less than a width of the upper metal layer 107.

Referring to FIGS. 1A-12, an electrical connection structure 100 may include a dielectric layer stack 102, including a plurality of extreme low-k (ELK) dielectric layers including a first ELK dielectric layer as an uppermost layer, and a second ELK dielectric layer under the first ELK dielectric layer, a plurality of metal layers (Ma-1, Ma-2, Mb-1, Mb-2, Mb-3, Mb-4, Mc) in the plurality of ELK dielectric layers, and a via stack 150 in the plurality of ELK dielectric layers and including a plurality of vias (Va-1, Va-2, Vb-1, Vb-2, Vb-3, Vb-4) connecting the plurality of metal layers (Ma-1, Ma-2, Mb-1, Mb-2, Mb-3, Mb-4, Mc), a first passivation layer on the dielectric layer stack 102, an upper metal layer 107 on the first passivation layer, a second passivation layer on the first passivation layer and on a side of the upper metal layer 107, an upper dielectric layer 109 on the second passivation layer and including an upper dielectric layer opening 119 over the upper metal layer 107 and the via stack 150 and a metal bump 111 on the upper metal layer 107 and contacting an upper surface of the upper metal layer 107 through the upper dielectric layer opening 119. A number of first metal layers Ma of the plurality of metal layers (Ma-1, Ma-2, Mb-1, Mb-2, Mb-3, Mb-4, Mc) in the first dielectric layer 102a may be 1 or more, a number of second metal layers Mb of the plurality of metal layers (Ma-1, Ma-2, Mb-1, Mb-2, Mb-3, Mb-4, Mc) in the second dielectric layer 102b may be 1 or more, and the number of second metal layers Mb may be greater than or equal to the number of first metal layers Ma. A number of first vias Va of the plurality of vias (Va-1, Va-2, Vb-1, Vb-2, Vb-3, Vb-4) in the first dielectric layer 102a, may be less than or equal to a number of second vias Vb of the plurality of vias (Va-1, Va-2, Vb-1, Vb-2, Vb-3, Vb-4) in the second dielectric layer 102b, and the number of second vias Vb of the plurality of vias (Va-1, Va-2, Vb-1, Vb-2, Vb-3, Vb-4) in the second dielectric layer 102b may be less than or equal to 3.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrical connection structure, comprising:
    a dielectric layer stack comprising:
        a plurality of dielectric layers including a first dielectric layer as an uppermost layer, and a second dielectric layer under the first dielectric layer;
        a plurality of metal layers in the plurality of dielectric layers;
        a via stack in the plurality of dielectric layers and comprising a plurality of vias stacked in a vertical direction and connecting the plurality of metal layers;
    an upper metal layer on the dielectric layer stack over the via stack; and
    an upper dielectric layer on the dielectric layer stack and on an upper surface of the upper metal layer and including an upper dielectric layer opening over the upper surface of the upper metal layer and the via stack, wherein a width of the upper dielectric layer opening is greater than a width of the plurality of metal layers in the dielectric layer stack, and:
        a number of first vias of the plurality of vias in the first dielectric layer, is less than or equal to a number of second vias of the plurality of vias in the second dielectric layer; and
        the number of second vias of the plurality of vias in the second dielectric layer is less than or equal to 3.

2. The electrical connection structure of claim 1, wherein:
    a number of first metal layers of the plurality of metal layers in the first dielectric layer is 1 or more;
    a number of second metal layers of the plurality of metal layers in the second dielectric layer is 1 or more; and
    the number of second metal layers is greater than or equal to the number of first metal layers.

3. The electrical connection structure of claim 2, wherein the dielectric layer stack further includes a third dielectric layer under the second dielectric layer, and a number of third metal layers of the plurality of metal layers in the third dielectric layer is equal to or greater than 1.

4. The electrical connection structure of claim 2, wherein the second metal layers comprise a second metal layer having an area less than or equal to 0.0228 µm².

5. The electrical connection structure of claim 4, wherein the second vias in the via stack comprise an upper second via on an upper surface of the second metal layer and a lower second via on a lower surface of the second metal layer, and a distance between the upper second via and the lower second via is less than or equal to 26.5 nm.

6. The electrical connection structure of claim 2, further comprising:
    a separated second via on a lower surface of an uppermost second metal layer of the second metal layers, the separated second via being separated from the via stack by a distance greater than 26.5 nm,
    wherein the number of second vias in the plurality of vias is 3, and the number of second metal layers in the plurality of metal layers is greater than 3.

7. The electrical connection structure of claim 1, wherein the plurality of dielectric layers comprises a plurality of extreme low-k (ELK) dielectric layers, the first dielectric layer comprises a first ELK dielectric layer including a first material, and the second dielectric layer comprises a second ELK dielectric layer including a second material different than the first material.

8. The electrical connection structure of claim 1, wherein the plurality of dielectric layers comprises a plurality of extreme low-k (ELK) dielectric layers, the first dielectric layer comprises a first ELK dielectric layer having a first thickness, and the second dielectric layer comprises a second ELK dielectric layer having a second thickness different than the first thickness.

9. The electrical connection structure of claim 1, wherein the upper metal layer comprises a redistribution layer, and the upper dielectric layer comprises a polymer dielectric layer and the width of the upper dielectric layer opening is less than a width of the redistribution layer.

10. The electrical connection structure of claim 1, further comprising:
    a metal bump in the upper dielectric layer opening and connected to the upper metal layer.

11. The electrical connection structure of claim 10, wherein the metal bump comprises one of a microbump interconnect structure or a C4 interconnect structure.

12. A method of making an electrical connection structure, comprising:
    forming a dielectric layer stack comprising:
        a plurality of dielectric layers including a first dielectric layer as an uppermost layer, and a second dielectric layer under the first dielectric layer;
        a plurality of metal layers in the plurality of dielectric layers; and
        a via stack in the plurality of dielectric layers and comprising a plurality of vias stacked in a vertical direction and connecting the plurality of metal layers;
    forming an upper metal layer on the dielectric layer stack; and
    forming an upper dielectric layer on the dielectric layer stack and on an upper surface of the upper metal layer, the upper dielectric layer including an upper dielectric layer opening over a center of the upper surface of the upper metal layer and the via stack, wherein a width of the upper dielectric layer opening is greater than a width of the plurality of metal layers in the dielectric layer stack, and:
        a number of first vias of the plurality of vias in the first dielectric layer, is less than or equal to a number of second vias of the plurality of vias in the second dielectric layer; and
        the number of second vias of the plurality of vias in the second dielectric layer is less than or equal to 3.

13. The method of claim 12, wherein the forming of the dielectric layer stack comprises forming the plurality of metal layers such that:
   a number of first metal layers of the plurality of metal layers in the first dielectric layer is 1 or more;
   a number of second metal layers of the plurality of metal layers in the second dielectric layer is 1 or more; and
   the number of second metal layers is greater than or equal to the number of first metal layers.

14. The method of claim 13, wherein the forming of the dielectric layer stack further comprises forming the plurality of dielectric layers to include a third dielectric layer under the second dielectric layer, and wherein a number of third metal layers of the plurality of metal layers in the third dielectric layer is equal to or greater than 1.

15. The method of claim 13, wherein the forming of the dielectric layer stack comprises forming the plurality of metal layers such that the second metal layers comprise a second metal layer having an area less than or equal to 0.0228 μm².

16. The method of claim 15, wherein the forming of the dielectric layer stack comprises forming the via stack such that the second vias comprise an upper second via on an upper surface of the second metal layer and a lower second via on a lower surface of the second metal layer, and a distance between the upper second via and the lower second via is less than or equal to 26.5 nm.

17. The method of claim 13, further comprising:
   forming a separated second via on a lower surface of an uppermost second metal layer of the second metal layers, the separated second via being separated from the via stack by a distance greater than 26.5 nm,
   wherein the number of second vias in the plurality of vias is 3, and the number of second metal layers in the plurality of metal layers is greater than 3.

18. The method of claim 12, wherein the forming of the dielectric layer stack comprises forming the plurality of dielectric layers to include a plurality of extreme low-k dielectric layers, so that the first dielectric layer comprises a first ELK dielectric layer and the second dielectric layer comprises a second ELK dielectric layer, and at least one of:
   the first ELK dielectric layer includes a first material, and the second dielectric layer includes a second material different than the first material; or
   the first ELK dielectric layer has a first thickness, and the second dielectric layer has a second thickness different than the first thickness.

19. The method of claim 12, further comprising:
   forming a metal bump in the upper dielectric layer opening and connected to the upper metal layer,
   wherein the upper dielectric layer comprises a polymer dielectric layer and the width of the upper dielectric layer opening is less than a width of the upper metal layer.

20. An electrical connection structure, comprising:
   a dielectric layer stack, comprising:
      a plurality of extreme low-k (ELK) dielectric layers including a first ELK dielectric layer as an uppermost layer, and a second ELK dielectric layer under the first ELK dielectric layer;
      a plurality of metal layers in the plurality of ELK dielectric layers; and
      a via stack in the plurality of ELK dielectric layers and comprising a plurality of vias stacked in a vertical direction and connecting the plurality of metal layers;
   a first passivation layer on the dielectric layer stack;
   an upper metal layer on the first passivation layer;
   a second passivation layer on the first passivation layer and on a side of the upper metal layer;
   an upper dielectric layer on the second passivation layer and on an upper surface of the upper metal layer and including an upper dielectric layer opening over the upper surface of the upper metal layer and the via stack, wherein a width of the upper dielectric layer opening is greater than a width of the plurality of metal layers in the dielectric layer stack; and
   a metal bump on the upper metal layer and contacting an upper surface of the upper metal layer through the upper dielectric layer opening,
   wherein:
      a number of first metal layers of the plurality of metal layers in the first dielectric layer is 1 or more;
      a number of second metal layers of the plurality of metal layers in the second dielectric layer is 1 or more; and
      the number of second metal layers is greater than or equal to the number of first metal layers, and
   wherein:
      a number of first vias of the plurality of vias in the first dielectric layer, is less than or equal to a number of second vias of the plurality of vias in the second dielectric layer; and
      the number of second vias of the plurality of vias in the second dielectric layer is less than or equal to 3.

* * * * *